(12) United States Patent  
Ely et al.

(10) Patent No.: US 6,522,128 B1  
(45) Date of Patent: Feb. 18, 2003

(54) POSITION SENSOR HAVING COMPACT ARRANGEMENT OF COILS

(75) Inventors: David T. F. Ely, Cambridge (GB); Andrew N. Dames, Cambridge (GB)

(73) Assignee: Synaptics (UK) Limited, Cambridgeshire (GB)

( * ) Notice: Subject to any disclaimer, the term of this patent is extended or adjusted under 35 U.S.C. 154(b) by 0 days.

(21) Appl. No.: 09/529,387

(22) PCT Filed: Oct. 15, 1998

(86) PCT No.: PCT/GB98/03100

§ 371 (c)(1),  
(2), (4) Date: Jun. 8, 2000

(87) PCT Pub. No.: WO99/19691

PCT Pub. Date: Apr. 22, 1999

(30) Foreign Application Priority Data

Oct. 15, 1997 (GB) .............................................. 9721891

(51) Int. Cl.⁷ .............................. G01B 7/30; G01B 7/14
(52) U.S. Cl. ......................... 324/207.17; 324/207.24; 324/207.25; 336/45; 340/870.32
(58) Field of Search ..................... 324/207.17, 207.12, 324/207.24, 207.25, 207.16, 207.15; 336/45, 200, 79; 340/870.32

(56) References Cited

U.S. PATENT DOCUMENTS

| | | | |
|---|---|---|---|
| 2,145,742 A | 1/1939 | Wechsung | |
| 2,867,783 A | 1/1959 | Childs | |
| 2,942,212 A | 6/1960 | Mynall | |
| 3,219,956 A | 11/1965 | Newell et al. | |
| 3,297,940 A | 1/1967 | Mulligan et al. | |

(List continued on next page.)

FOREIGN PATENT DOCUMENTS

| | | |
|---|---|---|
| DE | 1134848 | 8/1962 |
| DE | 3500121 A1 | 7/1986 |
| DE | 3620412 A1 | 12/1987 |
| EP | 0159191 A2 | 10/1985 |
| EP | 0 182 085 A2 | 5/1986 |

(List continued on next page.)

OTHER PUBLICATIONS

Patent Abstracts of J Apan, vol. 010, No. 009, (P–420), Jan. 14, 1986 & JP 60 165512A (Toshiba KK), Aug. 28, 1985.

Klatt, "Phase of Digital Data Fixes Shaft Angle", Electrical Design News, vol. 16, No. 12, Jun. 15, 1971, pp. 53–56, XP002045871.

Patent Abstracts of Japan, vol. 15, No. 37 (P–1159), Jan. 29, 1991 & JP 02 275314 A (Omron Tateisi Electron Co), Nov. 9, 1990.

Patent Abstracts of Japan, vol. 10, No. 32 (E–379), Feb. 7, 1986 & JP 60 189231 A (Matsushita Denki Sangyo KK, Sep. 26, 1985.

McDonnel, "The Use of Inductosyn to Digital Converters in Linear Control Systems", Automation, vol. 10, No. 11–12, Nov. 1975–Dec. 1975, pp. 31–32.

(List continued on next page.)

*Primary Examiner*—Jay Patidar
(74) *Attorney, Agent, or Firm*—Nixon & Vanderhye P.C.

(57) ABSTRACT

A transducer is provided for use in a position sensor which senses the position of two relatively movable members. In one form, the transducer has a plurality of sensor windings having a number of loops arranged in succession and connected in series so that signals induced in adjacent loops by a common electromagnetic field oppose each other and an excitation winding having at least one loop superimposed on but electrically isolated from the loops of the sensor windings.

50 Claims, 16 Drawing Sheets

U.S. PATENT DOCUMENTS

| | | |
|---|---|---|
| 3,482,242 A | 12/1969 | Hargrove |
| 3,647,963 A | 3/1972 | Bailey |
| 3,772,587 A | 11/1973 | Ferrand et al. |
| 3,812,481 A | 5/1974 | Stednitz |
| 3,851,242 A | 11/1974 | Ellis |
| 3,895,356 A | 7/1975 | Kraus |
| 3,898,635 A | 8/1975 | Kulterman |
| 3,906,436 A | 9/1975 | Kurauchi et al. |
| 3,962,663 A | 6/1976 | Visser |
| 4,005,396 A | 1/1977 | Fujiwara et al. |
| 4,014,015 A | 3/1977 | Gundlach |
| 4,065,850 A | 1/1978 | Burr et al. |
| 4,081,603 A | 3/1978 | Davis et al. |
| 4,092,852 A | 6/1978 | Fowler et al. |
| 4,094,572 A | 6/1978 | Burr et al. |
| 4,097,684 A | 6/1978 | Burr |
| 4,150,352 A | 4/1979 | Pomella et al. |
| 4,156,192 A | 5/1979 | Schedrovitsky et al. |
| 4,210,775 A | 7/1980 | Rodgers et al. |
| 4,223,300 A | 9/1980 | Wiklund |
| 4,255,617 A | 3/1981 | Carau, Sr. et al. |
| 4,341,385 A | 7/1982 | Doyle et al. |
| 4,423,286 A | 12/1983 | Bergeron |
| 4,425,511 A | 1/1984 | Borsh |
| 4,482,784 A | 11/1984 | Whetstone |
| 4,504,832 A | 3/1985 | Conte |
| 4,507,638 A | 3/1985 | Brosh |
| 4,532,376 A | 7/1985 | Rockwell |
| 4,577,057 A | 3/1986 | Blesser |
| 4,593,245 A | 6/1986 | Vierti et al. |
| 4,609,776 A | 9/1986 | Murakami et al. |
| 4,642,321 A | 2/1987 | Schoenberg et al. |
| 4,693,778 A | 9/1987 | Swiggett et al. |
| 4,697,144 A | 9/1987 | Howbrook |
| 4,697,244 A | 9/1987 | Murakami et al. |
| 4,704,501 A | 11/1987 | Taguchi et al. |
| 4,709,209 A | 11/1987 | Murakami et al. |
| 4,711,026 A | 12/1987 | Swiggett et al. |
| 4,711,977 A | 12/1987 | Miyamori et al. |
| 4,723,446 A | 2/1988 | Saito et al. |
| 4,734,546 A | 3/1988 | Landmeier |
| 4,737,698 A | 4/1988 | McMullin et al. |
| 4,786,765 A | 11/1988 | Yamanami et al. |
| 4,820,961 A | 4/1989 | McMullin |
| 4,848,496 A | 7/1989 | Murakami et al. |
| 4,868,443 A | 9/1989 | Rossi |
| 4,878,553 A | 11/1989 | Yamanami et al. |
| 4,891,590 A | 1/1990 | Hammel et al. |
| 4,893,077 A | 1/1990 | Auchterlonie |
| 4,902,858 A | 2/1990 | Yamanami et al. |
| 4,963,703 A | 10/1990 | Phillips |
| 4,975,546 A | 12/1990 | Craig |
| 4,985,691 A | 1/1991 | Pulyer et al. |
| 4,999,461 A | 3/1991 | Murakami et al. |
| 5,013,047 A | 5/1991 | Schwab |
| 5,028,745 A | 7/1991 | Yamanami et al. |
| 5,041,785 A | 8/1991 | Bogaerts et al. |
| 5,082,286 A | 1/1992 | Ryan et al. |
| 5,088,928 A | 2/1992 | Chan |
| 5,129,654 A | 7/1992 | Bogner |
| 5,136,125 A | 8/1992 | Russell |
| 5,177,389 A | 1/1993 | Schalk |
| 5,188,368 A | 2/1993 | Ryan |
| 5,381,091 A | 1/1995 | Kobayashi et al. |
| 5,406,155 A | 4/1995 | Persson |
| 5,434,372 A | 7/1995 | Lin |
| 5,486,731 A | 1/1996 | Masaki et al. |
| 5,619,431 A | 4/1997 | Oda |
| 5,625,239 A | 4/1997 | Persson et al. |
| 5,693,993 A | 12/1997 | Ito et al. |
| 5,748,110 A | 5/1998 | Sekizawa |
| 5,783,940 A | 7/1998 | Kolomeitsev |
| 5,815,091 A | 9/1998 | Dames |
| 6,124,708 A * | 9/2000 | Dames ................ 324/207.12 |
| 6,236,199 B1 * | 5/2001 | Irle et al. ............. 324/207.17 |
| 6,255,810 B1 * | 7/2001 | Irle et al. ............. 324/207.17 |
| 6,304,076 B1 * | 10/2001 | Madni et al. ............. 318/660 |

FOREIGN PATENT DOCUMENTS

| | | |
|---|---|---|
| EP | 0209513 A1 | 6/1986 |
| EP | 0218745 | 4/1987 |
| EP | 0313046 | 4/1989 |
| EP | 0537458 | 4/1993 |
| EP | 0552001 A1 | 7/1993 |
| EP | 0554900 | 8/1993 |
| EP | 0607694 A1 | 7/1994 |
| EP | 0657917 A1 | 6/1995 |
| EP | 0675581 A1 | 10/1995 |
| EP | 0680009 A2 | 11/1995 |
| EP | 0709648 A2 | 5/1996 |
| EP | 0716390 | 6/1996 |
| EP | 0 743 508 A2 | 11/1996 |
| EP | 0772149 | 5/1997 |
| FR | 1325017 | 3/1962 |
| FR | 2 298 082 | 8/1976 |
| FR | 2 682 760 | 4/1993 |
| GB | 851543 | 10/1960 |
| GB | 1122763 | 8/1968 |
| GB | 1452132 | 10/1976 |
| GB | 2012431 A | 7/1979 |
| GB | 2021273 A | 11/1979 |
| GB | 2042183 A | 9/1980 |
| GB | 2059593 A | 4/1981 |
| GB | 2064125 A | 6/1981 |
| GB | 2074736 A | 11/1981 |
| GB | 1604824 | 12/1981 |
| GB | 2103943 A | 3/1983 |
| GB | 2141235 A | 12/1984 |
| WO | WO 92/12401 | 7/1992 |
| WO | WO 94/25829 | 11/1994 |
| WO | 95/31696 | 11/1995 |
| WO | WO 96/03188 A1 | 2/1996 |
| WO | 97/14935 | 4/1997 |
| WO | WO 98/00921 | 1/1998 |

OTHER PUBLICATIONS

Electronics Letters, vol. 11, No. 1, Jan. 9, 1975, pp. 5–6, Gordon, Digital xy Position Indicator Using Walsh Functions.

Pulle et al, "A New Magnetoresistive Based Sensor for Switched Reluctance Drives" Proceedings of the Annual Power Electronics Specialists Conference (PECS), Toledo, Jun. 29–Jul. 3, 1992, vol. 2, No. CONF, Jun. 23, 29, 1992, pp. 839–843, Institute of Electrical and Electronics Engineers.

* cited by examiner

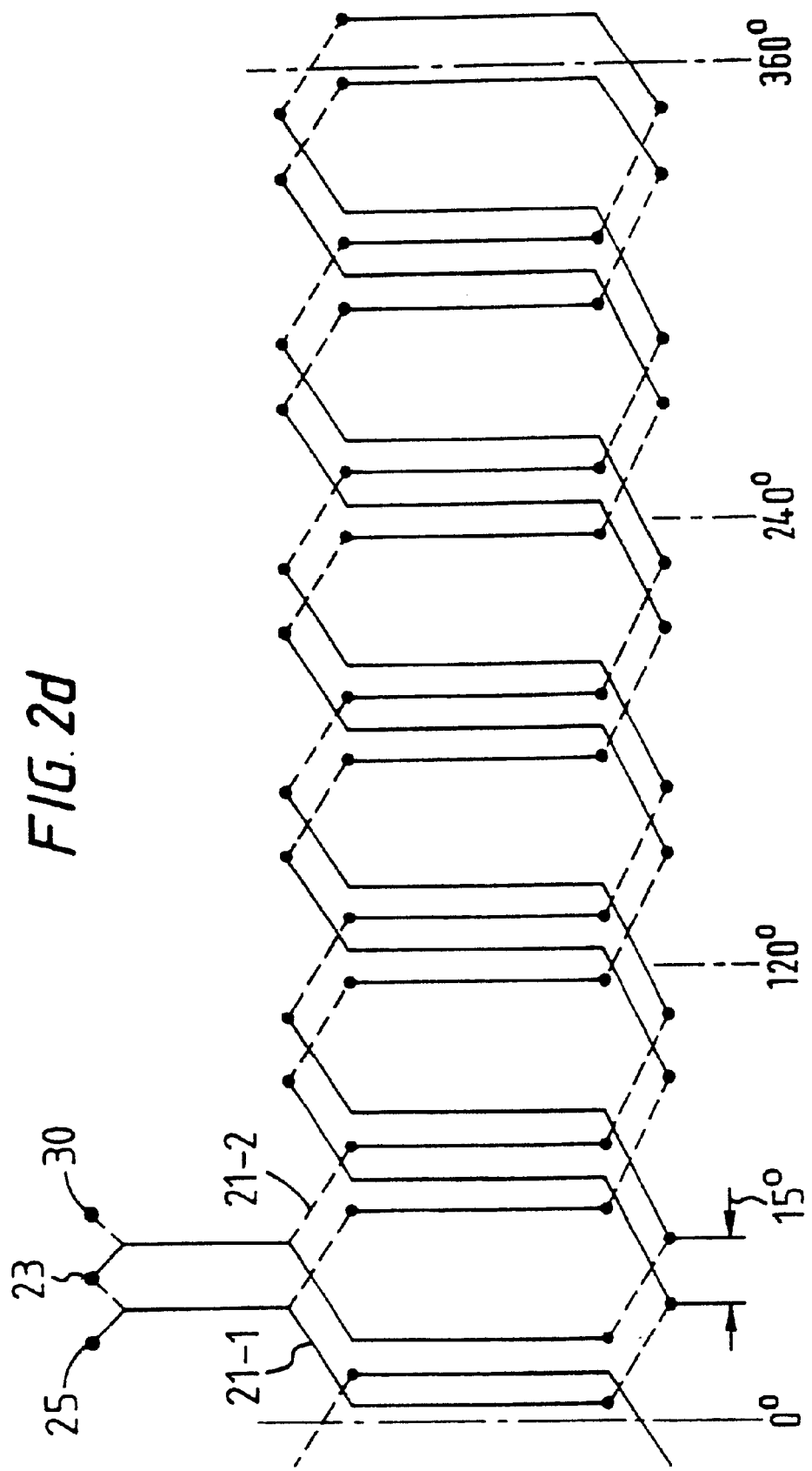

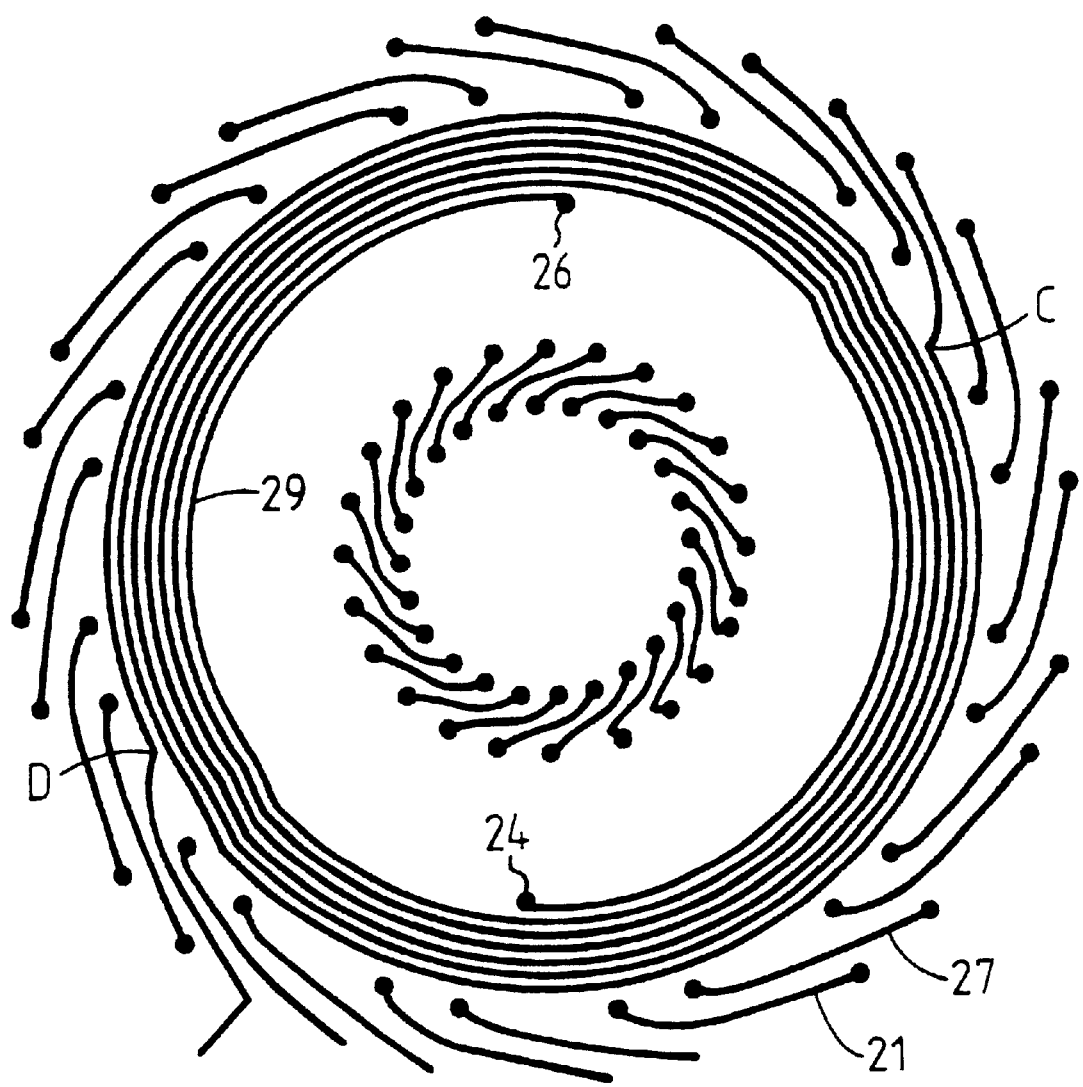

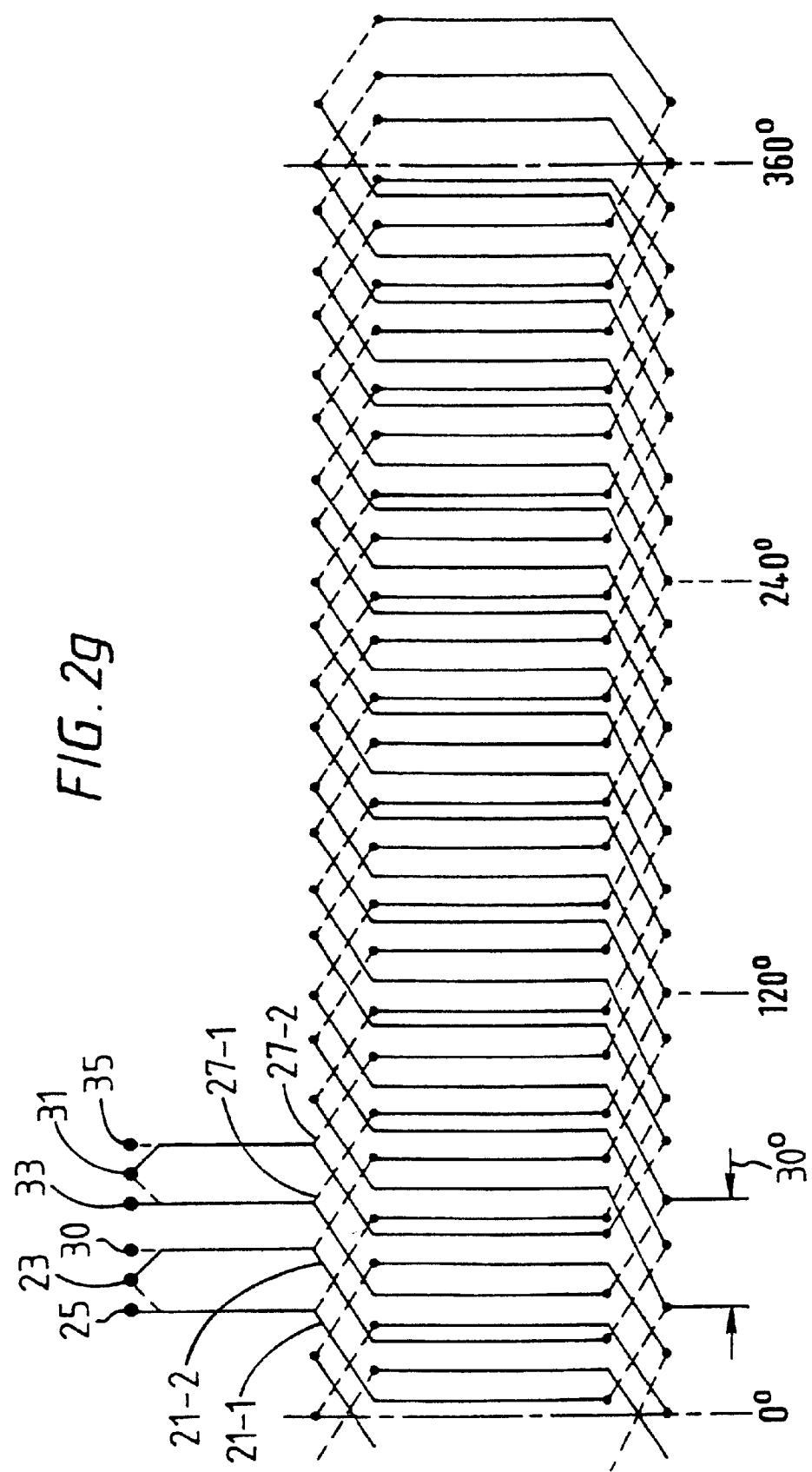

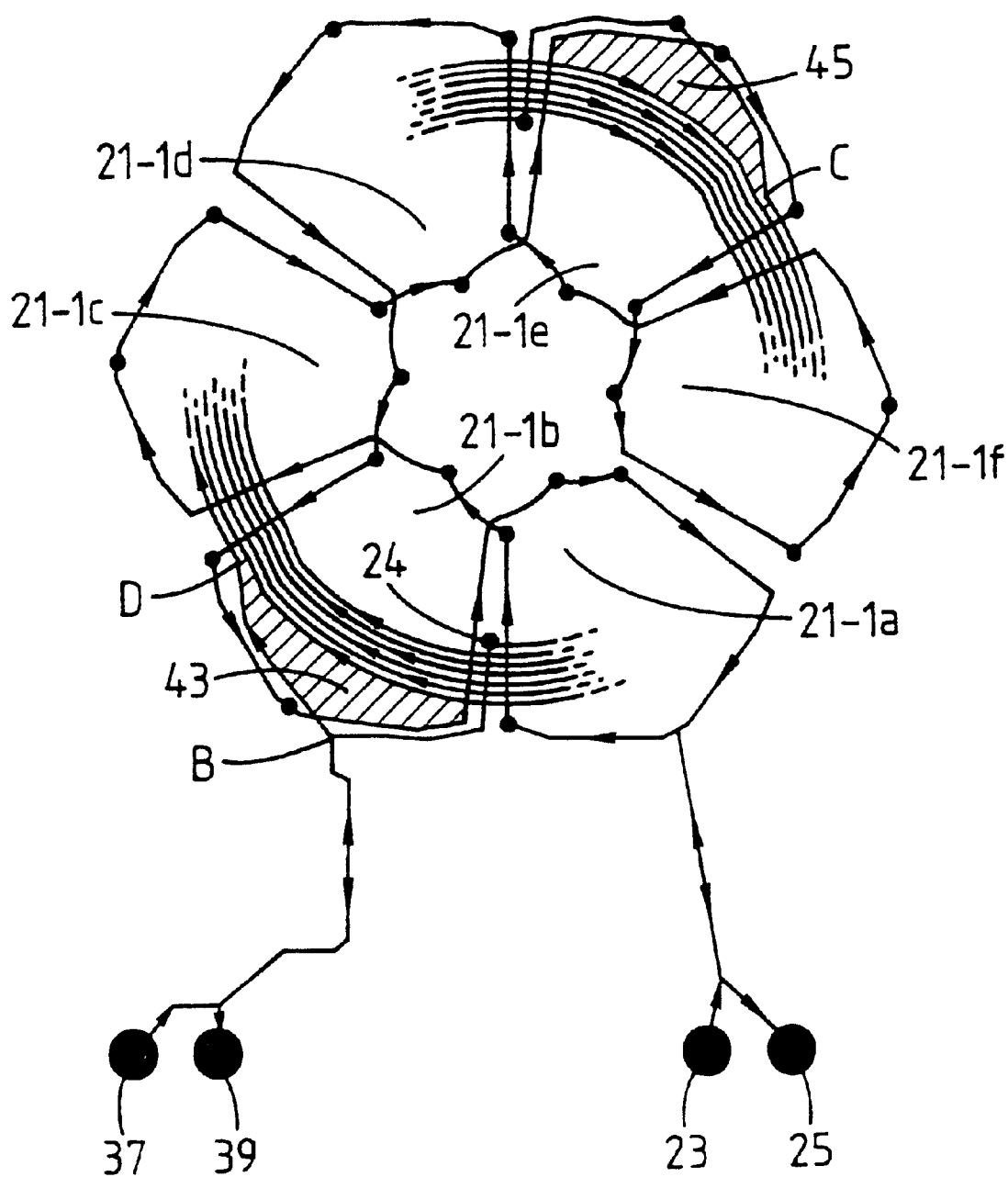

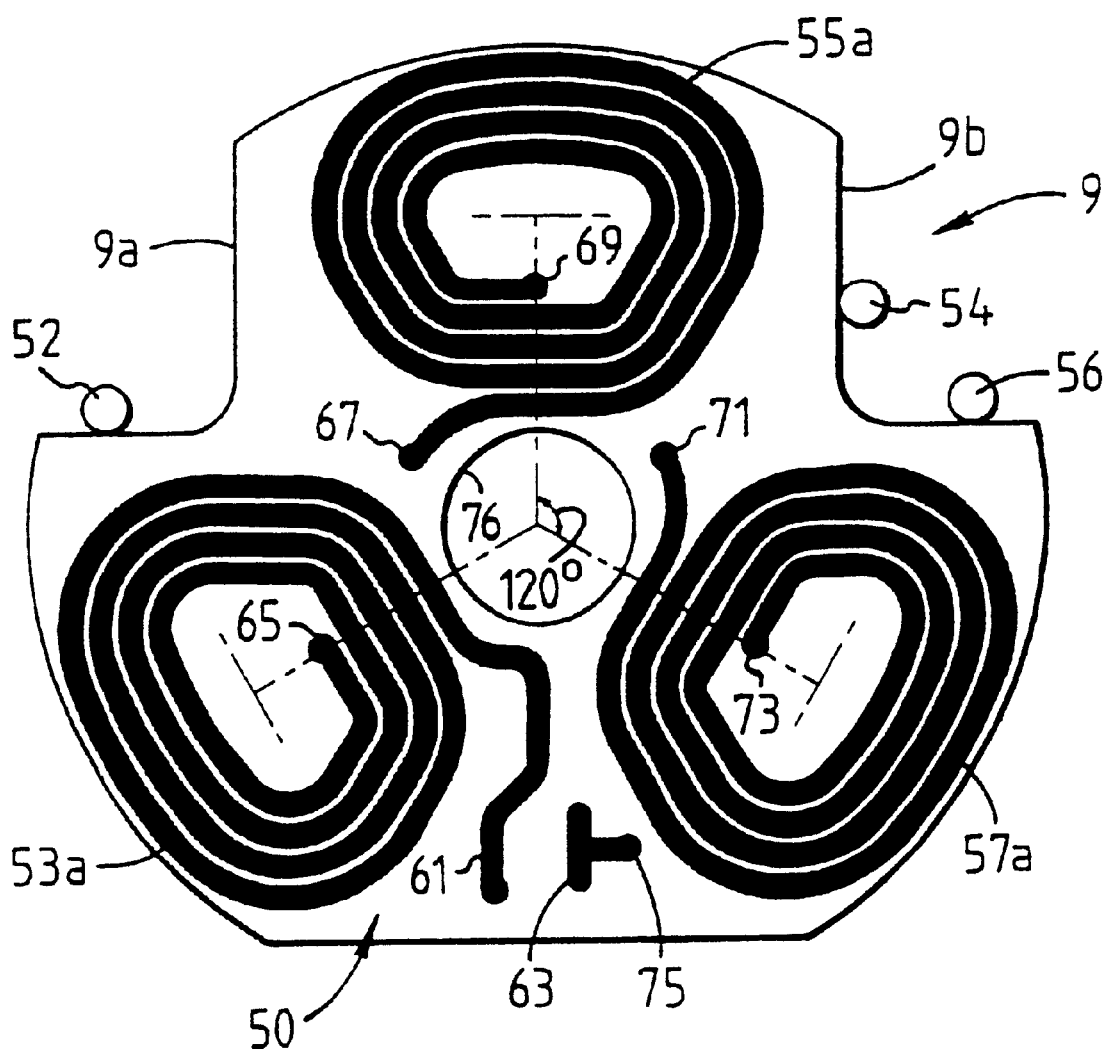

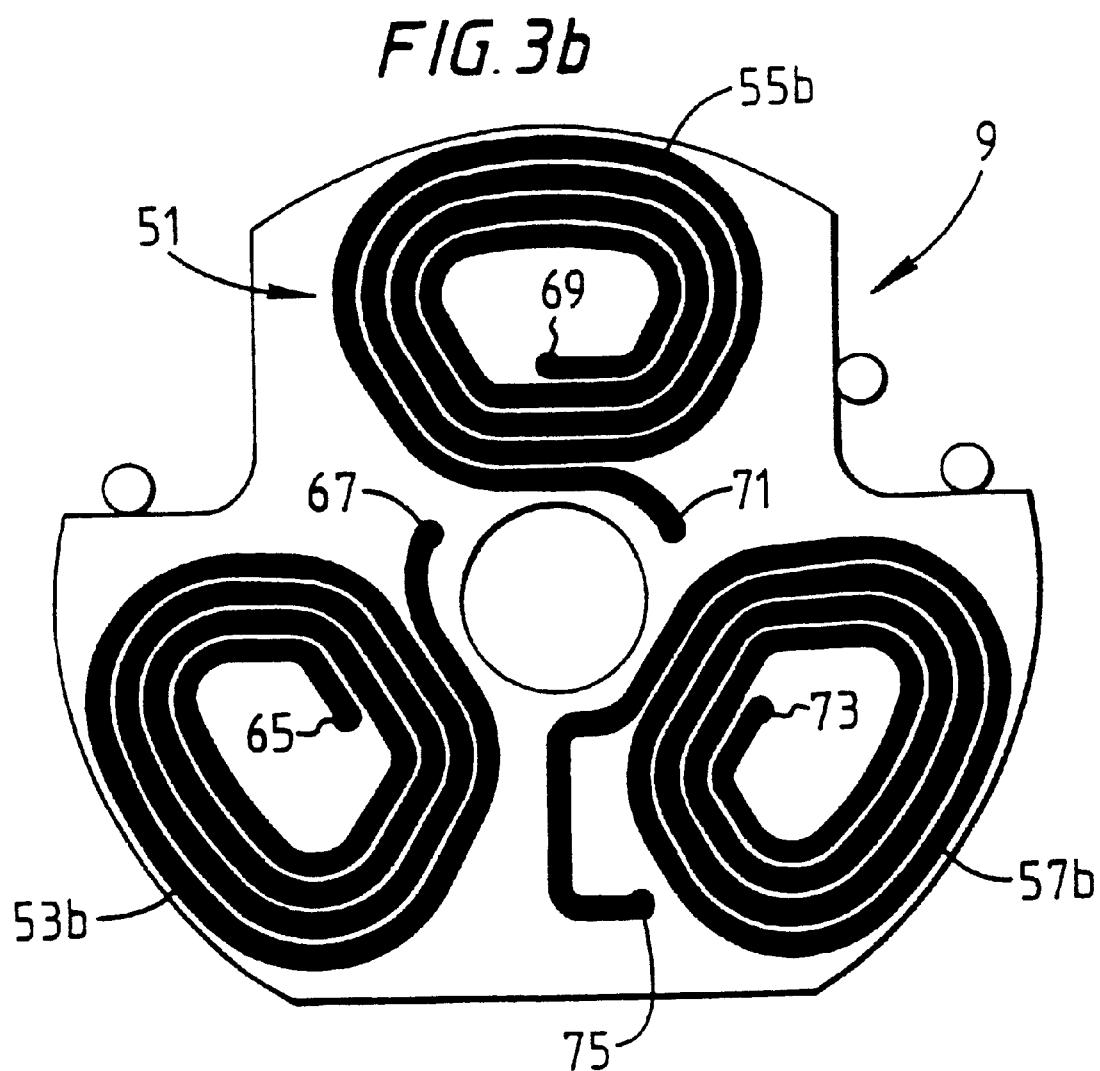

POSITION SENSOR HAVING COMPACT ARRANGEMENT OF COILS

BACKGROUND OF THE INVENTION

1. Field of the Invention

The present invention relates to an apparatus for use in a position sensor which senses the relative position between at least two relatively movable members. The invention has application in linear and rotary inductive position sensors.

2. Related Art

WO95/31696 discloses an inductive position sensor in which one member carries an excitation winding and a number of sensor windings mounted on a sensor printed circuit board and the other member carries a resonator, also mounted on a printed circuit board. In operation, an alternating current is applied to the excitation winding which causes an alternating magnetic field to be set up in the region of the sensor printed circuit board. This field inductively couples with the resonator when it is placed in proximity to the sensor printed circuit board, to cause the resonator to resonate. This in turn generates its own spatially patterned alternating magnetic field in the vicinity of the sensor printed circuit board. This resonator magnetic field induces alternating signals in the sensor windings whose amplitude sinusoidally varies with the relative position between the two members. A similar system is disclosed in EP 0182085 which uses a conductive screen in place of the resonator. However, the use of a conductive screen has the disadvantages that the output signal levels are much smaller and that the signal induced in the sensor windings by the conductive screen has substantially the same phase but opposite polarity to any signal generated in the sensor windings directly from the excitation winding. In contrast, with a resonator, there is a 90° phase shift between the signal induced in the sensor windings by the resonator and any signal induced in the sensor windings by the excitation winding. Therefore, with a resonator, it is possible to employ synchronous detection to isolate the resonator signal from any excitation breakthrough.

The design of the sensor windings in both these systems is critical to the operation of the position sensor. In particular, they must be shaped so that there is the necessary sinusoidal coupling with the resonator and so that there is minimum coupling with the excitation winding. This is achieved by forming the sensor windings from a number of series connected loops arranged so that signals induced in adjacent loops by a common magnetic field oppose each other and by forming the excitation winding as one or more loops around the periphery of the sensor windings.

One aim of the present invention is to provide an alternative geometry of sensor and excitation windings.

The sensor windings and the excitation windings are preferably formed on a two-layer printed circuit board since these are cheap and easy to manufacture as compared with multi-layer circuit boards. For low cost, small size and optimum EMC performance, the electronics used to generate the excitation current and to process the signals induced in the sensor windings should be mounted on the same circuit board as the sensor windings. In the systems provided to date, these connections have been made by twisted pair flying leads, which are fiddly, expensive and can be unreliable. Connections can be made using conventional PCB track routing techniques. However, the connection tracks usually result (i) in a disturbance in the sinusoidal coupling relationship between the sensor windings and the resonator; and (ii) in the sensor windings being sensitive to the magnetic field generated by the excitation coil, both of which reduce the overall accuracy of the position sensor.

One solution to this problem is simply to use multilayer printed circuit boards. However, this approach increases cost and can reduce position sensing accuracy since several printed circuit board layers require accurate registration instead of just two.

BRIEF SUMMARY OF THE INVENTION

According to one aspect, the present invention provides a transducer for use in a position encoder comprising: a first circuit having at least two loops connected in series and being arranged so that signals generated in the loops by a common electromagnetic field oppose each other; and a second circuit having at least one loop which extends along the measurement path and which is superimposed on but electrically isolated from the loops of the first circuit.

Such a transducer provides the advantage that for a given size of circuit board, the area of the loops of the first circuit can be maximised regardless of the number of turns of the second circuit.

This aspect also provides an apparatus for use in a position encoder comprising: a first plurality of conductor tracks arranged along a measurement path; a second plurality of conductor tracks arranged along the measurement path; wherein the first and second plurality of conductor tracks are superimposed on each other to define (i) a first circuit having at least two loops along the measurement path, the loops being connected in series and being arranged so that signals generated in the two loops by a common electromagnetic field oppose each other; and (ii) a second circuit having at least one loop which extends along said measurement path; characterised in that the conductor tracks of said first plurality of conductor tracks which form part of said first circuit are arranged in first and second groups which are transversely spaced relative to said measurement path; the conductor tracks of said second plurality of conductor tracks which form part of the first circuit are arranged for connecting conductor tracks in the first group with conductor tracks in the second group; and the conductor track or tracks of the second plurality of conductor tracks which form said at least one loop of said second circuit are located between said first and second groups of conductor tracks.

According to another aspect, the present invention provides a transducer for use in a position sensor, comprising: two layers of conductor tracks insulated, at least at any crossovers, by an insulator, the conductor tracks being arranged so as to define (i) a first circuit having at least two loops which extend along a measurement path, said loops being connected in series and being arranged so that signals induced in said at least two loops by a common magnetic field oppose each other; and (ii) a second circuit having at least one loop which extends along said measurement path and which is superimposed on but electrically isolated from said at least two loops of said first circuit; wherein an electromagnetic coupling area between the at least one loop of said second circuit and one or more loops of said first circuit is varied to oppose the effect of a variation coupling between the at least one loop of the second circuit and a loop of the first circuit caused by an arrangement of connection tracks to said second circuit.

Preferably, in this aspect, the second circuit comprises a multi-start spiral winding, and wherein said variation in coupling areas is provided in the vicinity of the or each start to the spiral winding.

BRIEF DESCRIPTION OF THE DRAWINGS

Exemplary embodiments of the present invention will now be described with reference to the accompanying drawings in which:

FIG. 2d illustrates two of the windings shown in FIG. 2c when stretched out over a linear path and illustrates the way in which these two windings are connected in series to form a sensor winding;

FIG. 2e shows a top layer of printed conductors which form part of a printed circuit board;

FIG. 2g shows the two sensor windings shown in FIG. 2c when stretched out over a linear path;

FIG. 2j shows the winding shown in FIG. 2a together with part of the excitation winding and illustrates the way in which the excitation winding is connected to its connection pads without coupling to the sensor windings;

FIG. 3a shows the top layer of a resonator printed circuit board;

FIG. 3b shows the bottom layer of the resonator printed circuit board;

DETAILED DESCRIPTION OF EXEMPLARY EMBODIMENTS

Figure 1:
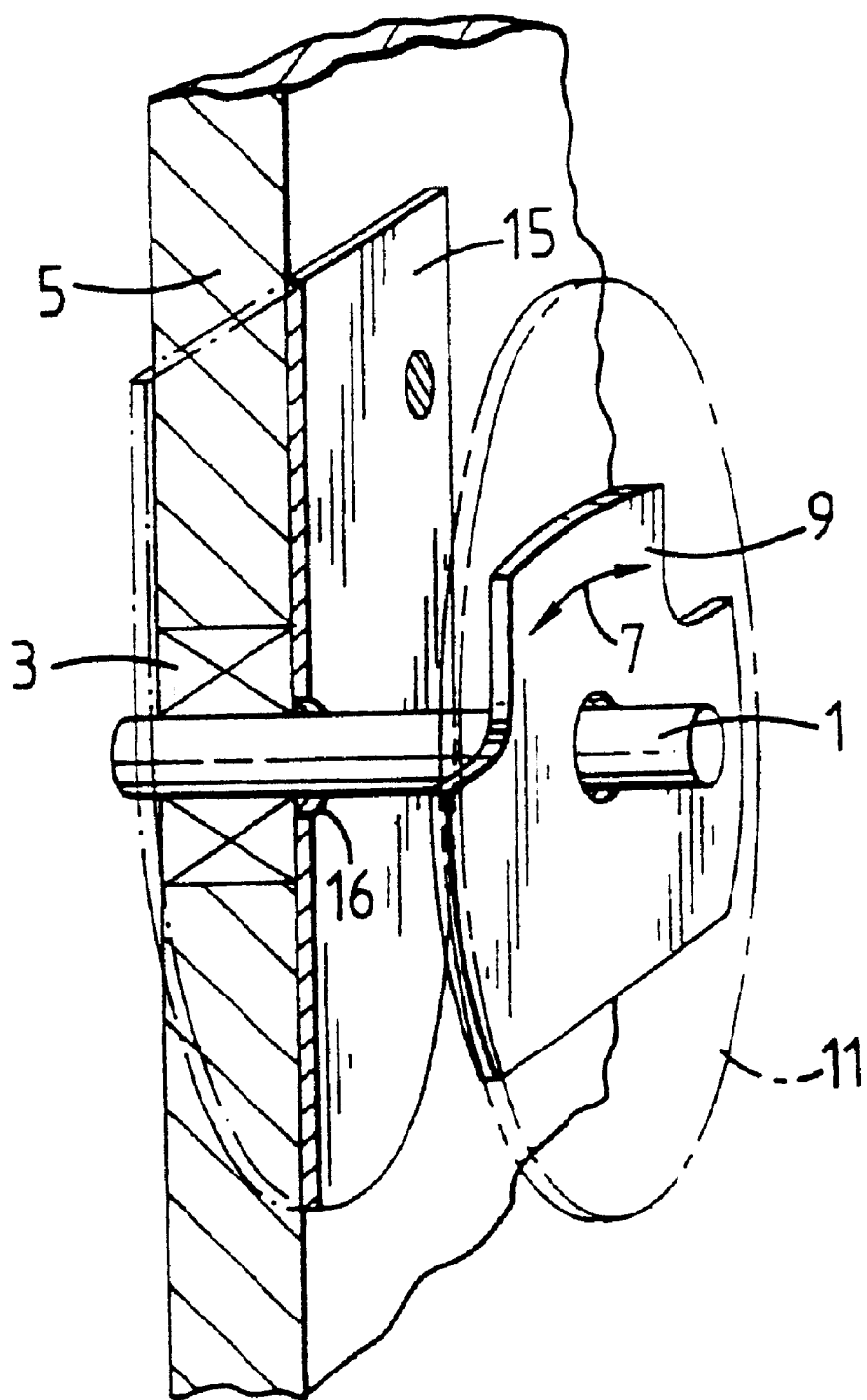
FIG. 1 schematically illustrates a rotating shaft having a position encoder mounted relative thereto, for encoding the position of the rotatable shaft.

FIG. 1 schematically shows a shaft 1 which is rotatable about its axis and which passes through a bearing 3 provided in a support wall 5. A first printed circuit board 9 carrying a resonator (not shown) is mounted for rotation (as represented by arrow 7) with the shaft 1 via bushing 11 next to a second printed circuit board 15 (shown in cross-section) which carries a number of sensor windings (not shown) and an excitation winding (not shown). The second printed circuit board 15 is fixed to the support wall 5 and has a central hole 16 through which the rotatable shaft 1 passes.

The excitation winding, sensor windings and the resonator are arranged such that when an excitation current is applied to the excitation winding, the resonator is energised which induces signals in the sensor windings, the peak amplitudes of which vary sinusoidally with the angle of rotation of the shaft. The sensor windings are connected to processing electronics (not shown) which processes the induced signals to determine the rotational angle of the rotatable shaft 1.

Figure 2A:
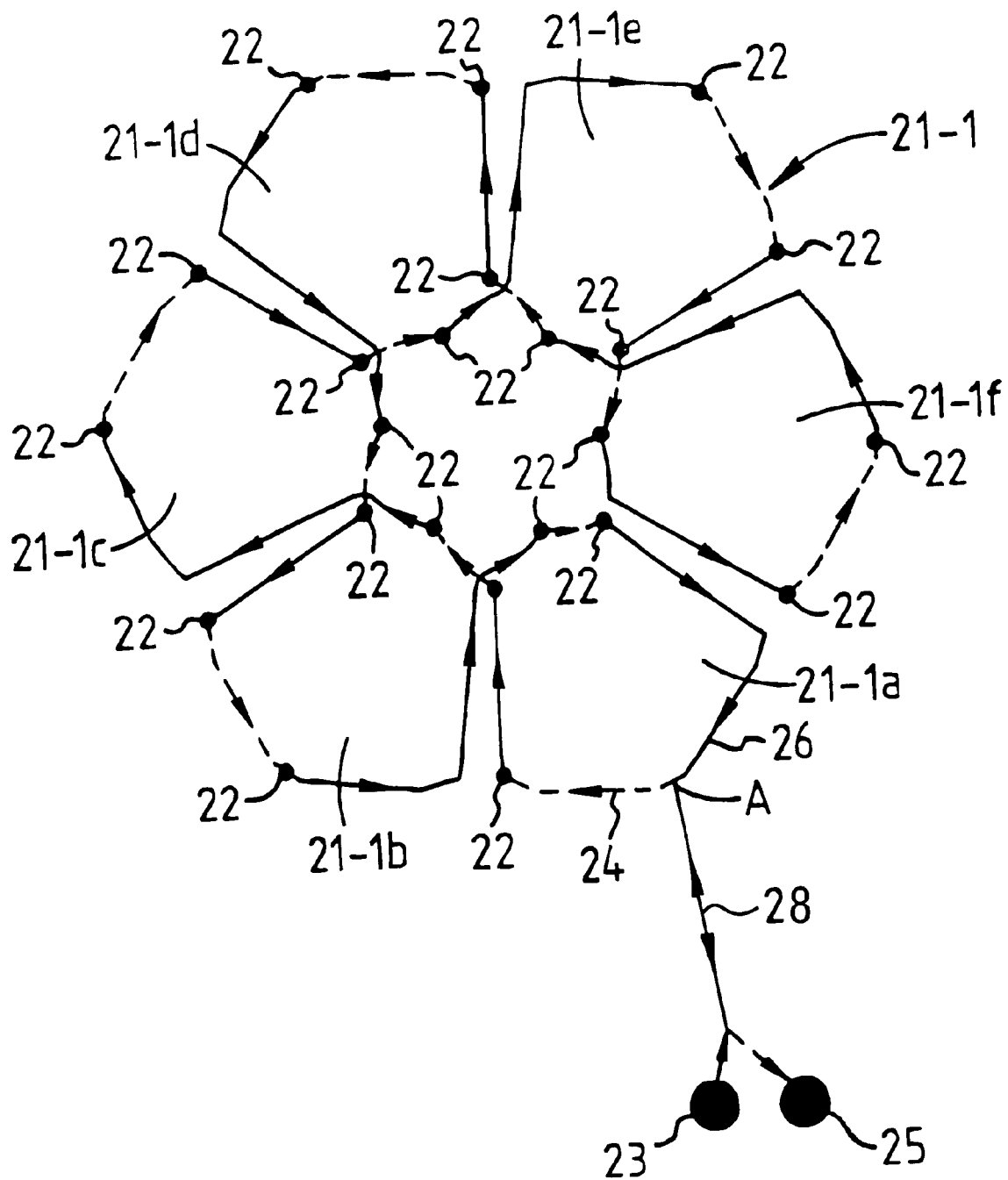
FIG. 2a schematically shows one turn of a sensor winding forming part of the position encoder shown in FIG. 1.
Figure 2B:
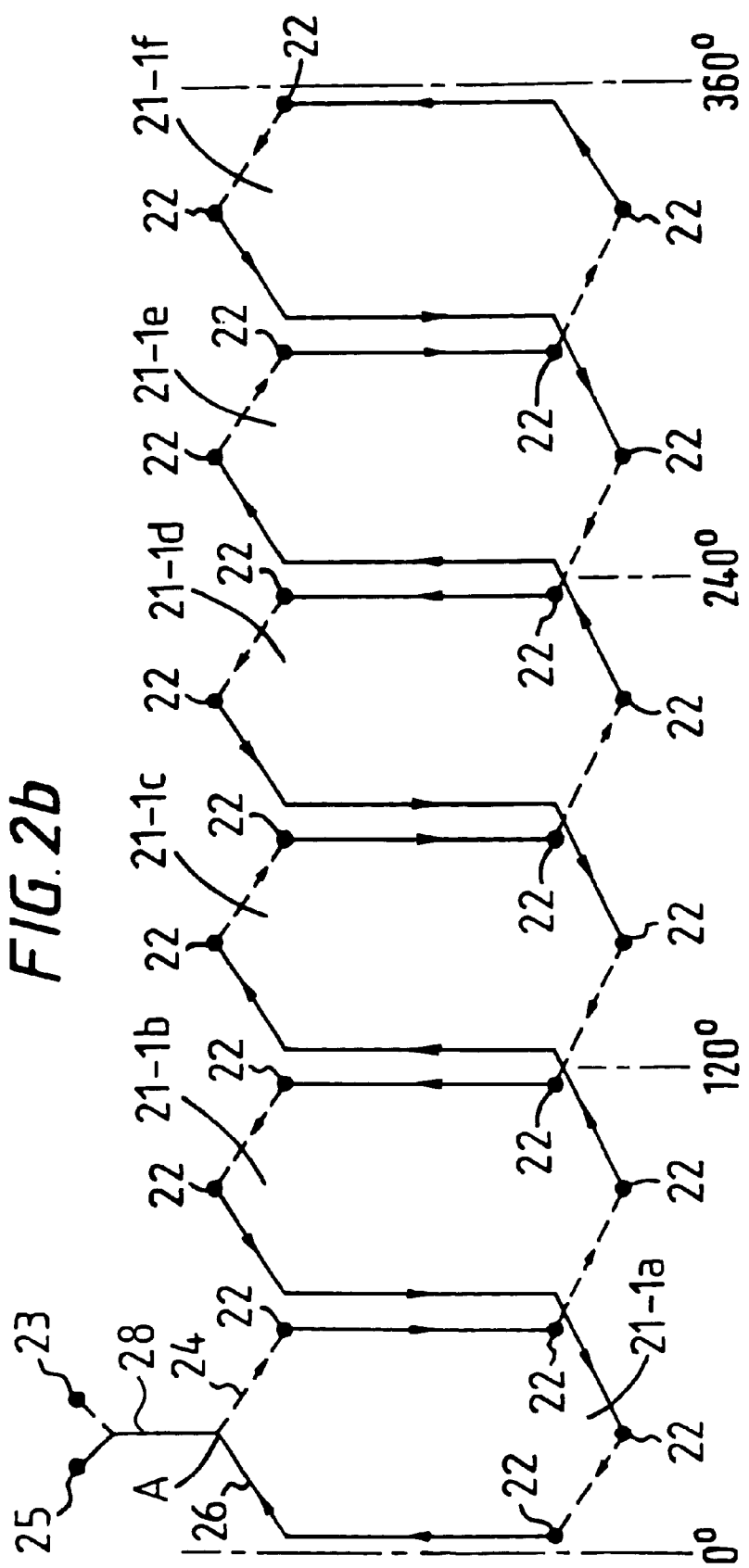
FIG. 2b schematically shows the form of the winding shown in FIG. 2a when stretched out in a linear path.

In this embodiment, two two-turn sensor windings are used which extend circumferentially around the circuit board 15. Each turn of each sensor winding has the same geometric form and comprises three periods of windings, each period extending circumferentially over an angle of approximately 120°. FIG. 2a shows the form of one turn 21-1 of one of the sensor windings 21 and FIG. 2b illustrates the form of this turn 21-1 when it is stretched out over a linear path. As shown in FIGS. 2a and 2b, sensor winding turn 21-1 comprises six hexagonal shaped loops 21-1a to 21-1f of series connected conductors, connected such that adjacent loops are wound in the opposition sense. Thus any EMF induced in one loop will oppose the EMF induced in an adjacent loop by the same magnetic field. In this embodiment, the area enclosed by each loop is approximately the same, thereby making each turn and hence each sensor winding relatively immune to background electromagnetic interference since EMFs induced in adjacent loops substantially cancel each other out.

In this embodiment, the sensor windings are formed on a two-layer printed circuit board having an approximate diameter of 25 mm. The conductors on the top side (which in use faces the support wall 5) are shown in FIGS. 2a and 2b as dashed lines, and the conductors on the bottom side (which in use faces the resonator circuit board 9) are shown in solid lines. As can be seen, the majority of the conductors are located on the side of the printed circuit board which, in use, will be nearest to the resonator printed circuit board 9. This ensures that there is maximum coupling between the resonator and the sensor windings. As can be seen from FIGS. 2a and 2b, the via holes 22 which connect the conductors on the top and bottom layers of the printed circuit board 15 are located at the inner and outer edges of the loops and the conductors connecting these edges are all on the bottom side of the printed circuit board.

In this embodiment, a connection is made from the sensor winding turn 21-1 to a pair of connection pads 23 and 25 by removing the via which would normally be at point A (for connecting conductors 24 and 26 which run on opposite sides of the printed circuit board) and by running a pair of connection tracks 28 from the ends of these conductors at point A to the connection pads 23 and 25. As shown, the connection tracks 28 follow each other on opposite sides of the PCB, thereby minimising any magnetic coupling between the connection tracks 28 and the resonator (not shown) and between the connection tracks 28 and the excitation winding (not shown).

Figure 2C:
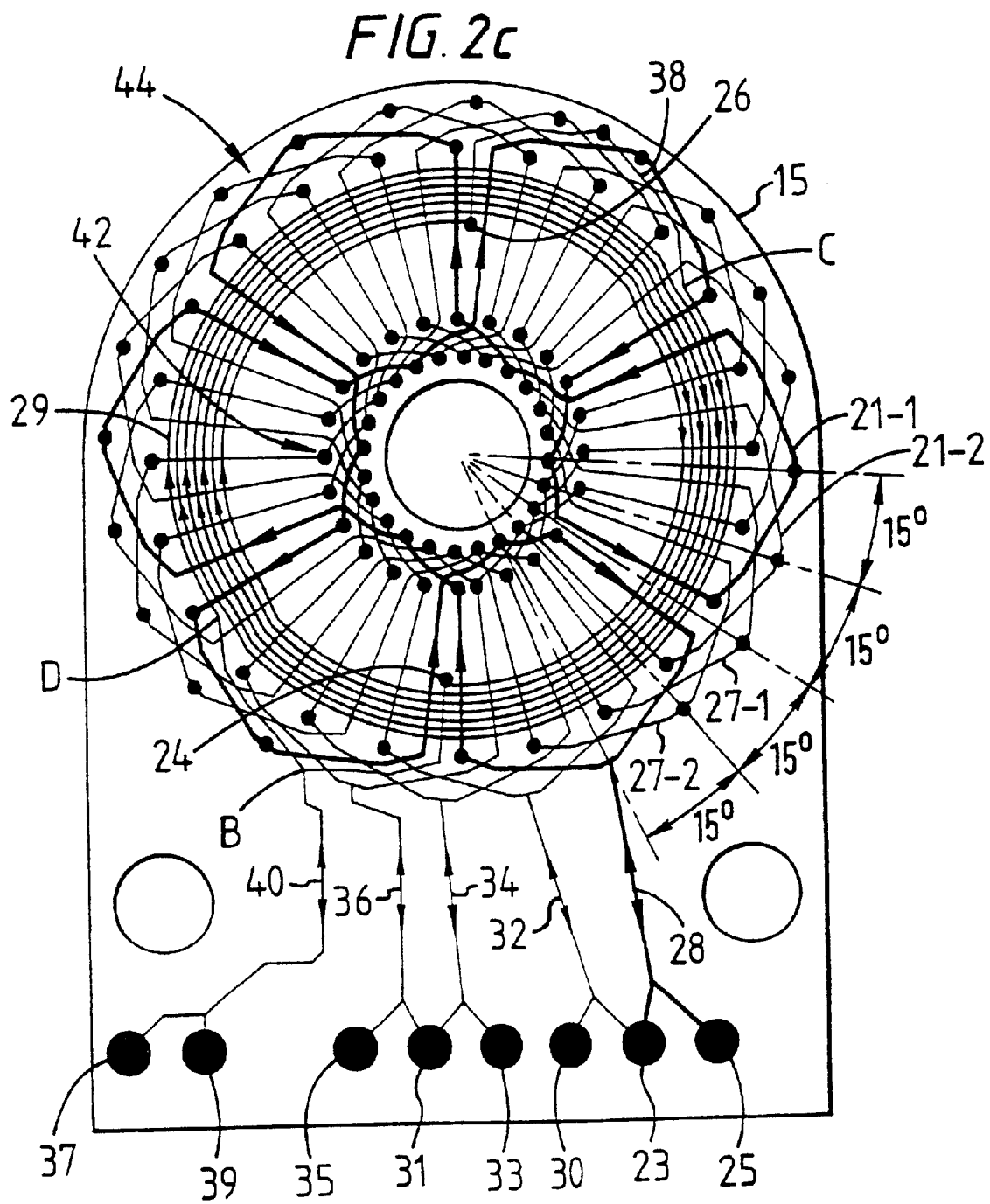
FIG. 2c shows a printed circuit board upon which the winding shown in FIG. 2a is mounted together with three similar windings and an excitation winding.

As mentioned above, in this embodiment, there are two two-turn sensor windings and an excitation winding on the printed circuit board 15. FIG. 2c shows the printed. circuit board 15 with all these windings. As shown, the first turn 21-1 of sensor winding 21 is highlighted by use of thicker lines and the two turns of each sensor winding 21 and 27 are circumferentially spaced apart by 15° (one-eighth of a period) and the first turn 21-1 of sensor winding 21 is circumferentially spaced apart by 30° (one-quarter of a period) from the first turn 27-1 of sensor winding 27. As shown, the second turn 21-2 of sensor winding 21 is connected to connection pads 23 and by a pair of connection tracks 32 which, like connection tracks 28, follow each other on opposite sides of the printed circuit board 15. Similarly, connection tracks 34 and 36 connect turns 27-1 and 27-2 respectively to connection pads 31 and 33 and 31 and 35 respectively. In this way, turns 21-1 and 21-2 are connected in series and turns 27-1 and 27-2 are also connected in series, and the connection tracks to these windings do not affect the magnetic coupling between the sensor windings 21 and 27 and the excitation winding and between the sensor windings 21 and 27 and the resonator.

Figure 2F:
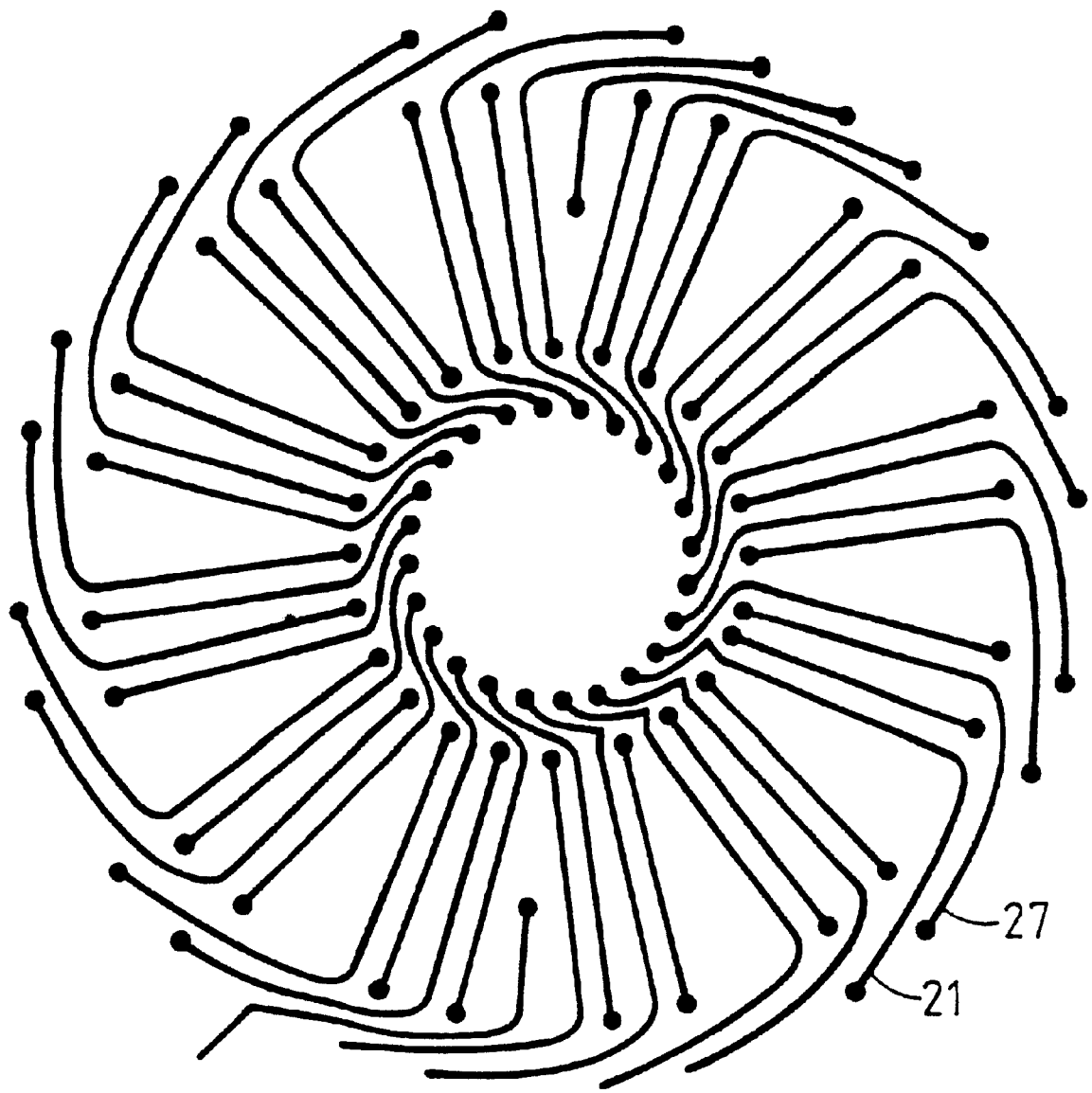
FIG. 2f shows the bottom layer of conductors which, together with the top layer of conductors shown in FIG. 2e, form a transducer having an excitation winding and two two-turn sensor windings in which the spacing between the turns of each sensor winding are arranged to reduce harmonic distortion.

FIG. 2d shows the two turns 21-1 and 21-2 which together form the sensor winding 21 when stretched out over a linear path. As shown, in this embodiment, the stagger or separation between the two turns is 15°. A two-turn sensor winding is used because it provides larger output signals and reduces spatial distortion. Lower spatial distortion means that the spatial coupling relationship between the resonator and the sensor windings is more nearly sinusoidal. This ensures a more accurate sensor. Ideally, the coil stagger angle should be in the region of one-sixth of the period (i.e. 20° in this embodiment), since this suppresses the major component of the harmonic error. The exact stagger angle for lowest harmonic distortion may not be exactly a sixth of a period and can be determined by experiment and or modelling. In this embodiment, a coil stagger angle of one-eighth of a pitch was chosen so as to avoid clashes between the conductors of each sensor winding due to lack of space. (An alternative approach is to stagger the positions of the radial lines closer to the optimum sixth of a period, while keeping the space-critical positions of the vias constant. The top and bottom layers of a printed circuit board which would form such sensor windings are shown in FIGS. 2e and 2f.)

FIG. 2g shows the four turns 21-1, 21-2, 27-1 and 27-2 of windings which form the two sensor windings 21 and 27 of this embodiment, stretched out over a linear path. As shown, the separation or stagger angle between the two sensor windings 21 and 27 is 30°, which corresponds to a quarter of a period. Therefore, the signals output by the respective sensor windings will be in phase quadrature.

Figure 2H:
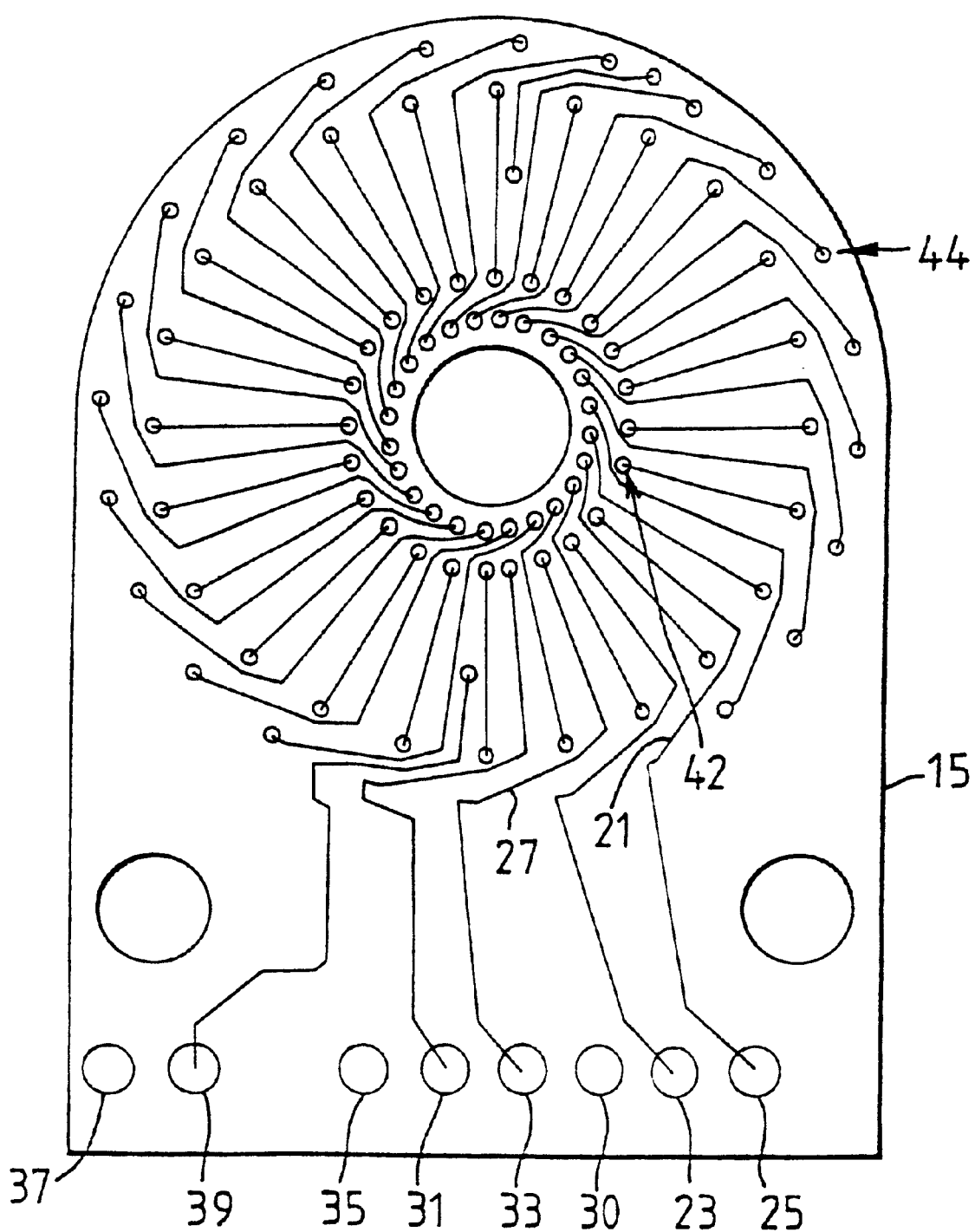
FIG. 2h shows a top layer of conductors forming part of the printed circuit board shown in FIG. 2c.
Figure 2I:
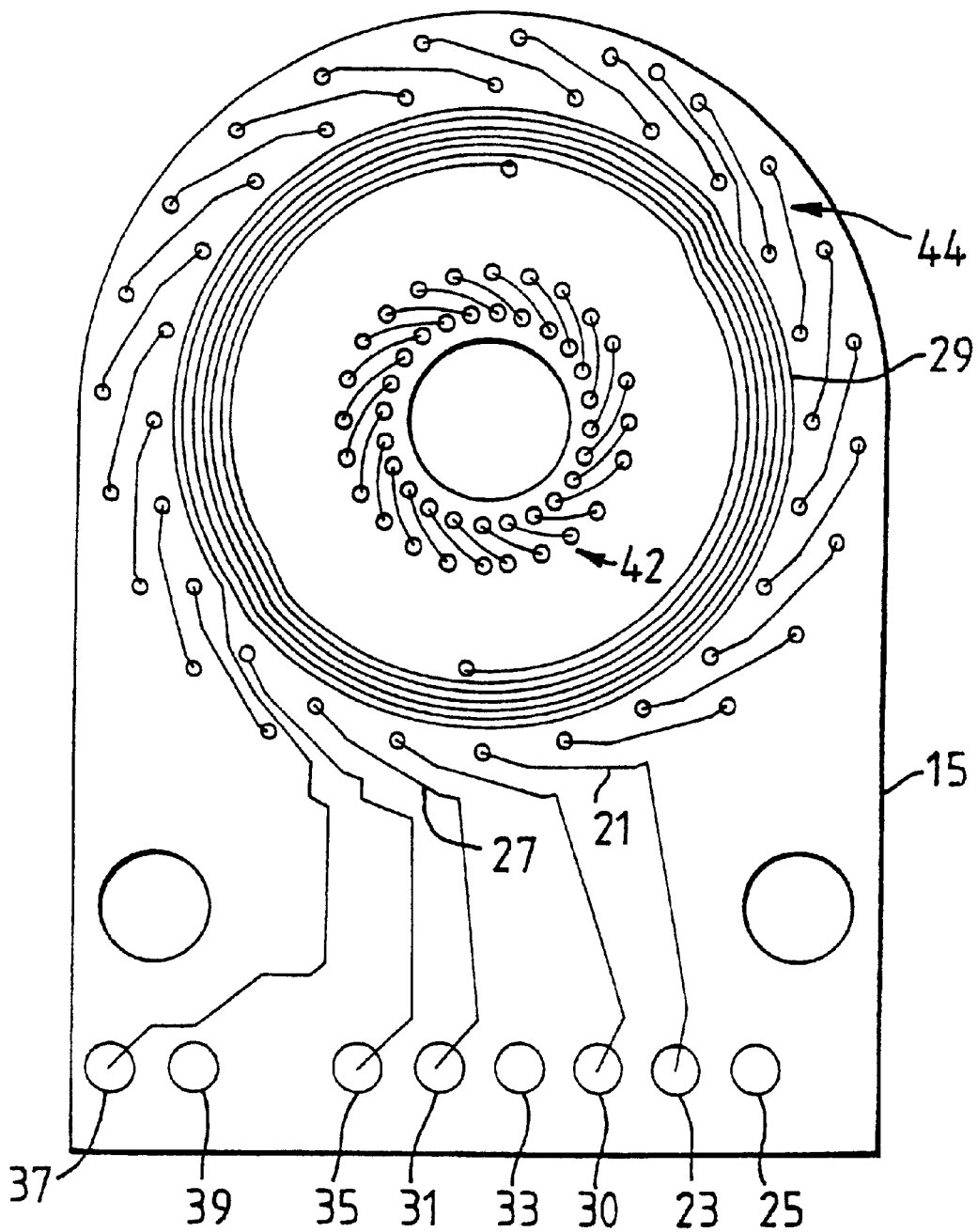
FIG. 2i shows the bottom layer of conductors forming part of the printed circuit board shown in FIG. 2c.

Referring again to FIG. 2c, the connections between the conductors forming the sensor windings 21 and 27 on the top and bottom layers of the circuit board 15 are provided by two inner circles of vias 42 and two outer circles of vias 44. FIG. 2h shows the bottom layer of conductors on the printed circuit board 15 (as seen from the top layer). As shown, conductor tracks between the inner circles of vias 42 and the outer circles of vias 44 are all made on this layer. Therefore, as shown in FIG. 2c, the excitation winding 29 can be wound on the top layer between these inner and outer circles of vias without clashing with the sensor windings 21 and 27. This is illustrated in FIG. 2i, which shows the conductors which are formed on the top layer of the printed circuit board 15.

As shown in FIG. 2c, the excitation winding 29 comprises seven concentric loops formed by a two-start spiral winding. In particular, the excitation winding 29 extends anticlockwise in an increasing spiral from via 24 to point C, where the outer loop is connected by conductor 38 to via 26. At via 26, the excitation winding 29 continues in an anticlockwise increasing spiral until point D. As those skilled in the art will appreciate, each loop of each sensor winding will couple with the excitation winding 29. However, since each loop is wound in the opposite sense, any signal induced from the excitation winding 29 in one loop will oppose the signal induced in an adjacent loop. Therefore, if the magnetic coupling between the excitation winding 29 and each loop of the sensor windings 21 and 27 is the same, then any signal induced in one loop by the excitation winding will substantially cancel with the signal induced in an adjacent loop and, therefore, there will be no net coupling between the excitation winding 29 and the sensor windings 21 and 27. However, as will become apparent from the following description, in this embodiment, it is not possible to ensure that the magnetic coupling between the excitation winding 29 and each loop of each sensor winding will be the same because of the connection tracks 40 which connect the excitation winding 29 to the connection pads 37 and 39.

As explained above, connections have been made to each turn of the sensor windings using connection tracks which have substantially no coupling with the resonator and the excitation winding 29. This is because the connection tracks follow each other on either side of the printed circuit board 15 and because the magnetic field generated by the excitation winding and by the resonator are predominantly perpendicular to the surface of the circuit board 15. As will be appreciated from FIGS. 2h and 2i, it is not possible, in this embodiment with a two layer circuit board design, to run a similar set of connection tracks to the excitation winding 29 without clashing with the sensor windings 21 and 27. In particular, with reference to FIG. 2c, the connection tracks 40 which connect the excitation winding 29 to the connection pads 37 and 39 pass from these pads on either side of the printed circuit board 15 to point B, where the connection track on the top layer of the printed circuit board 15 passes to the left until it reaches the outer turn of the excitation winding 29 at point D, and the connection track on the bottom layer of the printed circuit board 15 passes to the right and connects to the inner turn of the excitation winding 29 at the via hole 24. This divergence of the paths taken by the connection tracks 40 results in an imbalance in the coupling between the excitation winding 29 and the loops of the sensor windings 21 and 27.

The reason for this imbalance will now be explained with reference to FIG. 2j, which shows part of the excitation winding 29 and the first turn 21-1 of sensor winding 21. As shown, where the connection tracks 40 diverge at point B, there is an additional area 43 of overlap between the excitation winding 29 and the loop 21-1b as compared with, for example, the area of overlap between the excitation winding 29 and loop 21-1c. This additional overlap results in an increased magnetic coupling between the excitation winding 29 and loop 21-1b, than that between the excitation winding 29 and loop 21-1c. A similar imbalance is also created between the excitation winding 29 and the other sensor winding 27.

In this embodiment, a further imbalance is deliberately added to counter the imbalance caused by the connection tracks. In particular, a similar imbalance is generated by creating a similar area to area 43 in a loop of the winding 21-1 which is wound in the opposite sense. In this embodiment, this deliberate imbalance is made by adding the additional overlap area 45 in loop 21-1e, which is 180° spaced from the imbalance caused by the connection tracks in loop 21-1b. As those skilled in the art will appreciate, the deliberate imbalance could have been made at any one of the loops 21-1a, 21-1c or 21-1e. Alternatively, a smaller imbalance could have been added to each of these loops in order to counter the main imbalance caused by the connection tracks.

FIG. 3a shows the top layer of the resonator printed circuit board 9 and FIG. 3b shows the bottom layer of the resonator circuit board 9, as it would be seen from the top layer. The printed circuit board 9 is formed from a circular disc having a diameter of approximately 25 mm and has two cutout regions 9-a and 9-b which receive securing pins 52, 54 and 56 which are mounted on the bushing 11 and which, in use, secure the circuit board 9 relative to the bushing 11. As shown in FIG. 3a, the top layer of circuit board 9 comprises three coil portions 53a, 55a and 57a which are circumferentially spaced apart by 120°. Similarly, the bottom layer of the resonator printed circuit board 9, as shown in FIG. 3b, comprises three coils 53b, 55b and 57b which are also circumferentially spaced apart by 120°, with coil 53b being located directly behind coil 53a, with coil 55b being located directly behind coil 55a and with coil 57b being located directly behind coil 57a. In this embodiment, in use, the top layer of the resonator circuit board 9 faces the sensor circuit board 15 with a separation therebetween of approximately 2 mm.

Each of the coils 53, 55 and 57 are connected in series and the ends of the coils are connected to a pair of capacitor mounts 61 and 63 which connect a pair of capacitors in series with the coils to form an LC resonator 50. More specifically, the conductor track extends from capacitor mount 61 on the top layer of the resonator circuit board 9 in an anticlockwise decreasing spiral to define the coil 53a until it reaches via 65, where the track passes through to the other side of the board 9. From via 65, the conductor track extends on the bottom layer of the board 9 in an anticlockwise increasing spiral to define coil 53b until it reaches via 67 where the track returns to the top layer of the circuit board 9. The conductor track then continues in an anticlockwise decreasing spiral to define coil 55a until it reaches via 69 where it passes back through to the bottom layer of the circuit board 9. The conductor track winds from via 69 in an anticlockwise increasing spiral to define coil 55b until via 71 where the conductor passes back to the top layer of the circuit board. From via 71, the track winds in an anticlockwise decreasing spiral direction to define coil 57a until it reaches via 73. At via 73, the conductor passes back to the bottom layer and continues in an anticlockwise increasing spiral to define the coil 57b until it reaches via 75, where the track is connected to the other capacitor mount 63.

When the circuit board 9 is rotatably mounted on the bushing 11 and the circuit board 15 is fixed to the support wall 5 so that the inner edge 76 of the resonator circuit board 9 is concentric with the inner edge 16 of the sensor circuit board 15, the coils 53, 55 and 57 are located adjacent the excitation winding 29 and the sensor windings 21 and 27. When an excitation current is applied to the excitation winding 29, the magnetic field generated by the excitation winding couples with the conductor tracks of the coils 53, 55 and 57 which are closest to the outer edge of the circuit board 9, to induce an EMF in each of these coils. Since the coils are all wound in the same direction, these EMFs add and a resonator current is generated which flows through each coil 53, 55 and 57, thereby generating a spatially patterned resonator magnetic field having three principal axes located at the centres of the coils 53, 55 and 57. Since the resonator 50 has the same number of coils 53, 55 and 57 as there are periods of sensor winding, and since the separation between these coils corresponds to one period of the sensor windings, the asymmetries in the excitation winding 29 in regions 43 and 45 shown in FIG. 2h, do not affect the coupling between the excitation winding 29 and the resonator 50 which remains constant for all angular positions of the resonator board 9.

As will be appreciated by those skilled in the art, when the resonator 50 is resonating, the spatially patterned magnetic field generated by the resonator will interact with the sensor windings 21 and 27 to generate an output signal in each which will vary with the angular position of the resonator circuit board 9. For example, when coil 53 is located over loop 21-1a, coil 55 will be located over loop 21-1c and coil 57 will be located over loop 21-1e. Since each of the coils 53, 55 and 57 are wound in the same direction, when the resonator is resonating, the same size and magnitude of EMF will be induced in each of these three loops 21-1a, 21-1c and 21-1e the magnetic field generated by the current flowing in these coils. Since these loops of the sensor winding 21 are wound in the same direction, these EMFs will add with each other to create an output signal.

When the resonator circuit board 9 rotates relative to the sensor windings so that the coils 53, 55 and 57 are located between adjacent sensor loops, the EMFs induced in the adjacent loops will cancel each other out to generate no resulting output signals in sensor winding turn 21-1. As the resonator board rotates further, so that, for example, coils 53, 55 and 57 are located adjacent loops 21-1b, 21-1d and 21-1f, the induced EMFs therein will all add together but will be of opposite polarity to the total EMF which was induced when the resonator board 9 was at an angle such that coils 53, 55 and 57 were opposite loops 21-1a, 21-1c and 21-1e.

Therefore, as the resonator rotates relative to the sensor coils 21 and 27, the output signals induced therein will vary periodically as the resonator board 9 rotates. Since the two sensor windings 21 and 27 are circumferentially spaced apart by a quarter of a period, the periodic variation of the signal induced in one sensor winding will be in phase quadrature with the periodic variation of the signal induced in the other sensor winding. Ideally, this periodic variation should be exactly sinusoidal. However, there are usually higher order harmonic variations which cause distortion in the output signals. As mentioned above, in an embodiment which uses multiturn sensor windings, it is possible to arrange for the spacing between the conductors of the different turns to reduce this harmonic distortion. The effect of this harmonic distortion also decreases as the gap between the resonator circuit board 9 and the sensor circuit board 15 increases. However, in this embodiment, with a 25 mm diameter device and a gap between the resonator circuit board 9 and the sensor circuit board 15 of 2 mm, most of these harmonic distortions can be ignored.

Figure 4:
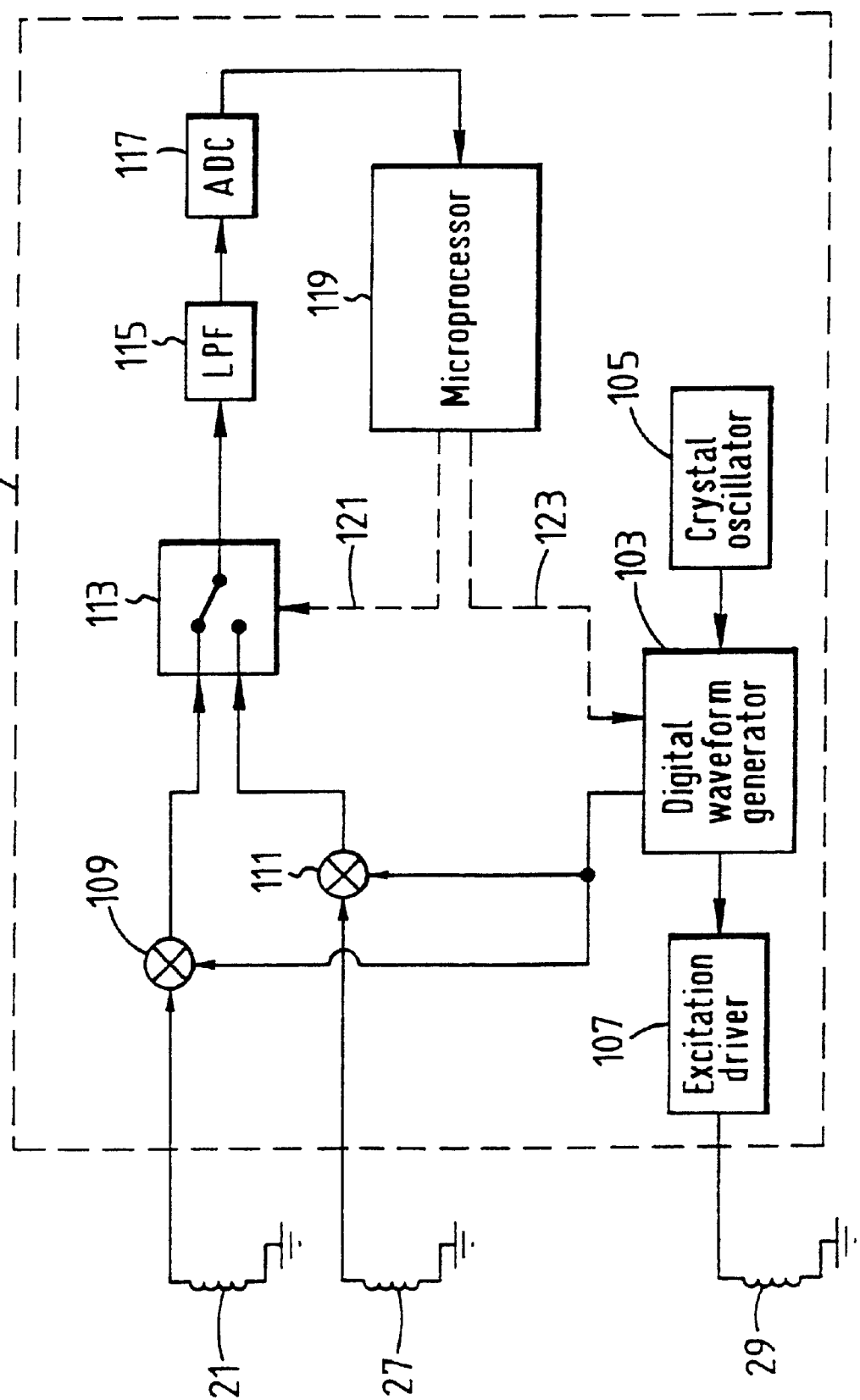
FIG. 4 is a schematic representation of excitation and processing circuitry used to energise the excitation winding shown in FIG. 2c and to process the signals received in the sense windings shown in FIG. 2c.

FIG. 4 shows the excitation and processing circuitry 101 used to energise the excitation winding 29 and to process the signals induced in the sensor windings 21 and 27. In this embodiment, the excitation and processing circuitry 101 is mounted on the circuit board 15 and is connected to the excitation winding 29 at connection pads 37 and 39 and is connected to the sensor windings 21 and 27 at connection pads 25 and 30 and 33 and 35 respectively. As shown, the excitation and processing circuitry 101 comprises a digital waveform generator 103 which is operable to receive an oscillating input from a crystal oscillator 105 and to output the excitation signal which is applied to the excitation winding 29 via an excitation driver 107.

Figure 5:
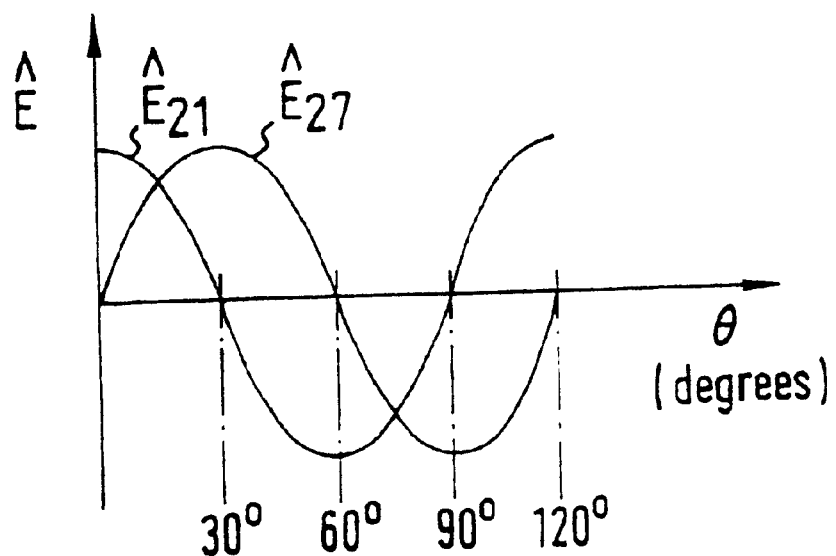
FIG. 5 illustrates the way in which the peak amplitude of the signal induced in each sense winding varies with the angular position of the rotatable shaft.

In this embodiment, the excitation signal is a squarewave voltage having a fundamental frequency $F_0$ of 1 MHz, which is matched-to the resonant frequency of the resonator 50 mounted on the resonator circuit board 9. The excitation current flowing in the excitation winding 29 generates an electromagnetic field in the vicinity of the resonator circuit board 9 which causes the resonator 50 to resonate. When resonating, the resonator 50 creates its own magnetic field which induces an EMF in each of the receive windings 21 and 27 whose peak amplitudes ($\hat{E}_{21}$ and $\hat{E}_{27}$) vary sinusoidally in phase quadrature with the rotation of the resonator 50. The way in which these peak amplitudes vary with rotation angle (θ) is shown in FIG. 5. As shown, the sinusoidal variation repeats every 120°, corresponding to the period or pitch of the sensor windings 21 and 27.

As shown in FIG. 4, the EMF induced in the sensor windings 21 and 27 are input to mixers 109 and 111 respectively, where they are mixed with a 90° phase-shifted version of the excitation signal which is applied to the excitation winding 29, in order to demodulate the induced EMFs. The 90° phase shift is required due to the operation of the resonator 50 when it resonates. The outputs from the mixers 109 and 111 will each comprise a DC component corresponding to the respective peak amplitudes of the EMFs induced in the corresponding sensor windings, together with high frequency time varying components.

The outputs from the mixers are then fed, one after the other, through switch 113 to a low pass filter 115 which removes these high frequency time varying components. These peak amplitude values are then converted from an analogue value into a digital value by the analogue-to-digital converter 117 and passed to the microprocessor 119 which determines the rotational angle of the resonator board 9 by using an arc-tangent function on these digital values. (As represented by the dashed lines 121 and 123, the microprocessor 119 also controls the switching of the switch 115 and the signals generated by the digital waveform generator 103.) As those skilled in the art will appreciate, the microprocessor 119 will be able to unambiguously determine the rotation angle of the resonator board over a shaft angle of 120°. This position encoder would, therefore, be suitable for determining the angular position of a throttle valve in an engine, which only rotates through 90°. Alternatively, if the microprocessor 119 counted the cycles, then the rotation of the resonator board 9 can be continuously tracked.

A brief overview has been given of the excitation and processing circuitry employed in the present embodiment. A more detailed explanation can be found in, for example, the applicant's earlier International Application WO95/31696, the contents of which are incorporated herein by reference. An alternative processing circuitry which does not use an arc-tangent function to determine the rotation angle can be found in the applicant's earlier International Application WO98/00921, the contents of which are also incorporated herein by reference.

The above embodiment has a number of significant advantages over the prior art systems described in the introduction. These include:

(1) As a result of winding the excitation windings over the loops of the sensor windings, efficient utilisation of printed circuit board space is achieved. In particular, for a given size of sensor printed circuit board, more turns of excitation winding can be provided whilst maintaining the largest possible size of sensor winding loops. In the prior art systems where the excitation winding is wound around the outside of the sensor loops, if the number of turns of the excitation winding is increased, then either the width of the sensor printed circuit board must be increased or the width of the sensor winding loops must be decreased. In some applications, it is not possible to increase the size of the sensor circuit board and reducing the size of the sensor winding loops decreases the output signal levels.

(2) Connections are made from each of the sensor windings to the processing electronics (a) without creating any significant disturbance in the sinusoidal coupling relationship between the sensor windings and the resonator; (b) without creating any significant net coupling between the sensor windings and the excitation windings; and (c) without making the sensor windings susceptible to background electromagnetic interference.

(3) A two-layer printed circuit board has been provided in which the excitation winding is wound inside the sensor windings and in which the excitation winding has been connected to the excitation electronics using printed circuit board tracks without creating a net magnetic coupling with any of the sensor windings. This is achieved by deliberately adding an imbalance to counter the imbalance caused by the excitation winding's connection tracks.

(4) Since connection pads to each of the sensor windings and to the excitation winding are located on the outside of the track patterns, connections can be made thereto in a simple manner.

(5) Since the loop area of the sensor windings has been maximised for a given size of printed circuit board, the device can operate over larger separations between the sensor circuit board 15 and the resonator circuit board 9, because the rate of signal fall-off with this separation is slower. This is important where both parts are individually sealed for environmental protection since larger separations enable thicker layers of protective coating, which are generally cheaper and easier to apply and more robust.

(6) The outer radius of the excitation winding is maximised and the inner radius is minimised so that the coupling to the resonator is maximised. This is achieved in this embodiment (a) by winding the outer loop of the excitation winding as close as possible to the outer circles of vias 44; and (b) by making the radius of the inner loop of the excitation winding equal the distance from the centre of the resonator circuit board 9 to the centre point of the resonator coils 53, 55 or 57. This is because the excitation winding mainly couples with the tracks of the coils 53, 55 and 57 which are at the outer edge of the circuit board 9. As the width of the excitation winding increases towards the inner tracks of these coils, the overall coupling with the excitation winding decreases since the coupling in these inner tracks opposes the coupling in the outer tracks.

(7) A multi-turn excitation winding is provided which increases the inductance of the excitation winding, thereby allowing: (a) use of common sensor supply voltages (approximately three volts), thereby allowing the elimination of step-down voltage conversion circuitry; and (b) the use of a half-bridge or a full-bridge switching amplifier rather than a less efficient linear power amplifier for amplifying the signal output by the signal generator before it is applied to the excitation winding.

Modifications and Alternative Embodiments

Figure 6:
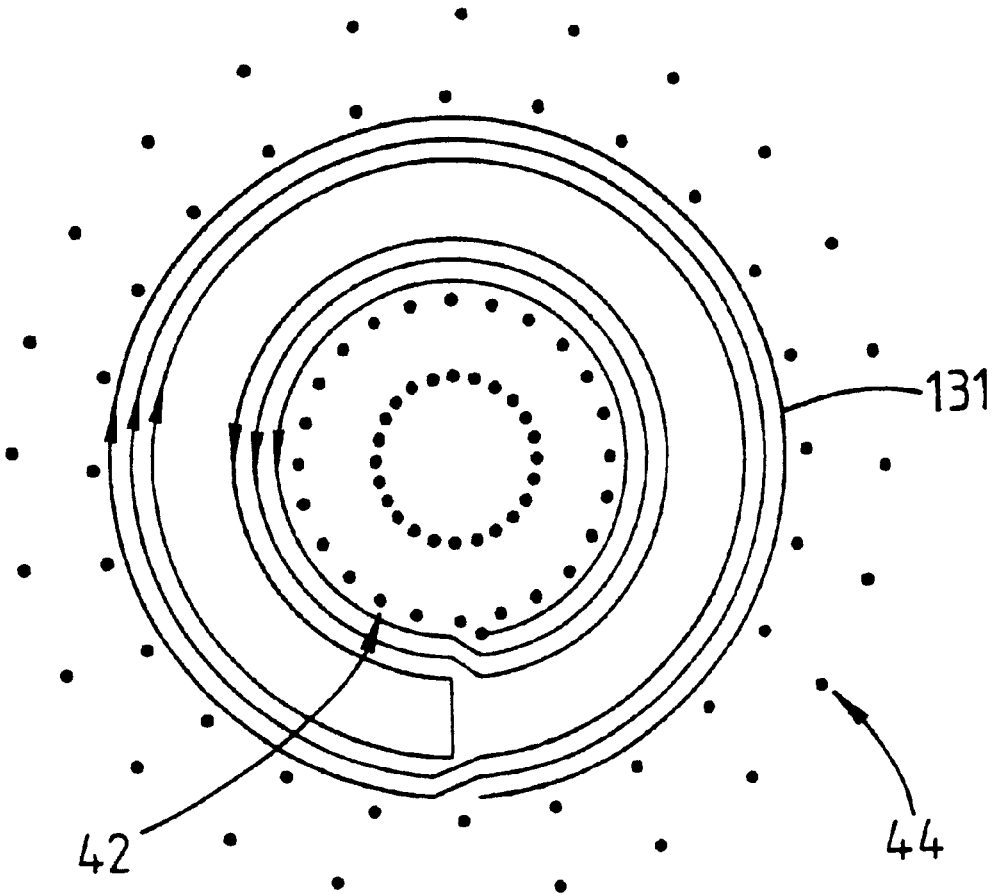
FIG. 6 illustrates an alternative form of the excitation winding shown in FIG. 2c.

In the above embodiment, a multi-turn excitation winding was used in which all the windings were wound in the same direction. Whilst this provides the advantages of increased inductance, it suffers from the disadvantage that there is a limit to how many turns the excitation winding can have before the coupling with the resonator begins to reduce. FIG. 6 illustrates an alternative form of excitation winding 131 having six series-connected turns of winding in which the outer three turns are wound in one direction and the inner three turns are wound in the opposition direction. This excitation coil has the advantage of having an increased magnetic coupling with the resonator since the outer turns will couple with the tracks at the outside edge of the resonator circuit board and the inner tracks will couple with the tracks at the inside edge of the resonator circuit board which will add to the coupling with the outside tracks. Since there is increased coupling between the resonator and the excitation winding 131, this results in greater signal levels and hence improved accuracy and electromagnetic interference performance. FIG. 6 also shows the inner and outer circles of vias 42 and 44 associated with the sensor windings (not shown). Although not shown in FIG. 6, the connection tracks between the excitation circuitry and the ends of the excitation winding 131 can be made in a similar manner to the way these connections were made in the first embodiment, so that there will be no coupling between the excitation winding and the sensor windings.

A further benefit of the excitation winding shown in FIG. 6 is that is reduces the electromagnetic emission from the excitation winding which may interfere with other electronic circuits. Additionally, it is possible to make the excitation coil substantially immune to electromagnetic interference by including more turns on the inner coil so that the magnetic dipole of the inner and outer coils are equal and opposite. The disadvantage of such an embodiment is that the excitation winding will have reduced inductance and this will make it harder to drive.

In the first embodiment, the excitation winding comprised a two start spiral winding. It is possible to counter the imbalance caused by the connection tracks by creating a corresponding imbalance in, for example, the inner loop of a single start spiral winding. However, the multi-start spiral winding is preferred, because the imbalance can be made in a symmetric manner and if the excitation voltage is differentially applied to the excitation winding through a full bridge switching circuit, then the two-start spiral winding will reduce the effects of capacitive coupling between the excitation winding and the sensor windings.

In the first embodiment, it was mentioned that an imbalance can be added to several loops of the sensor winding in order to counteract the imbalance caused by the connection tracks. Preferably, the number of spiral starts to the excitation winding equals the number of imbalances (including the connection track imbalance), so that these imbalances remain symmetrical with each other.

In the above embodiments, two two-turn periodic sensor windings were provided having a period corresponding to a rotational angle of 120°. As those skilled in the art will appreciate, the above techniques can also be used in embodiments having any number of sensor windings having any number of periods wound circumferentially around the sensor circuit board and having any number of turns. For example, two one-turn single-period sensor windings could be provided which are circumferentially spaced apart around the circuit board by 90°. From the signals induced in these sensor windings, the position of the resonator can be unambiguously determined over 360°. However, multiple-turn sensor windings are preferred because of the advantages discussed above and should be used where space permits.

Figure 7:
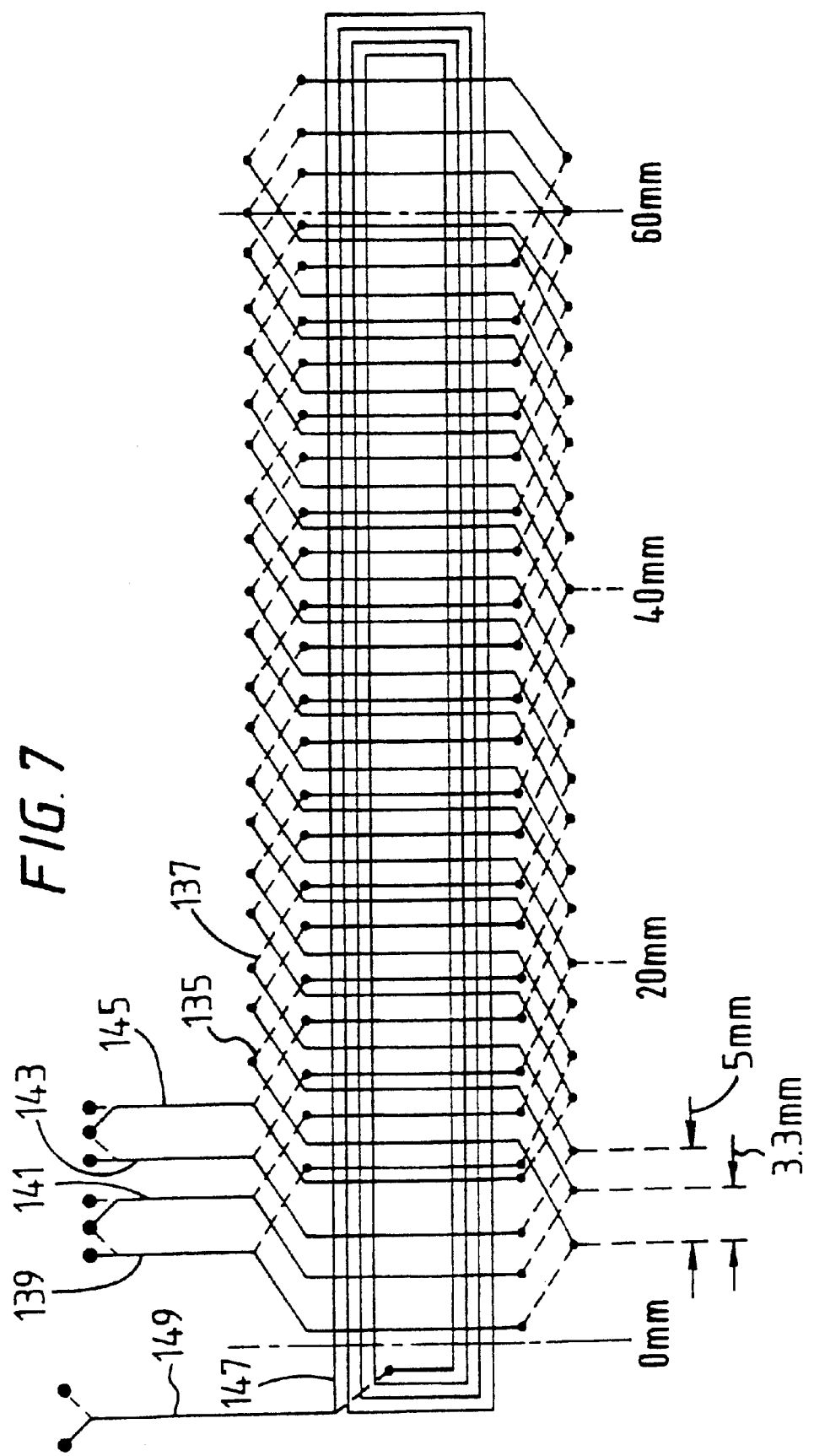
FIG. 7 illustrates the form of an excitation and a set of sensor windings forming part of a linear encoder.

The above embodiments which have been described relate to rotary position encoders. Many of the features of the first embodiment will also apply to linear position encoders. FIG. 7 shows two three-period, 20 mm pitch two-turn sensor windings 135 and 137 in which the separation between the turns of each sensor winding is a sixth of the pitch (3.3 mm) and the separation between the first turn of winding 135 and the first turn of winding 137 is a quarter of the pitch (5 mm). As in the first embodiment, connections are made from the two turns of each sensor winding using connection tracks 139, 141, 143 and 145 which do not disturb the sinusoidal coupling relationship between the sensor coils and the resonator (not shown) and which do not couple with the excitation winding 147.

As shown in FIG. 7, in this embodiment, the excitation winding 147 comprises four turns of conductor which pass through the centre of the sensor winding loops. In this embodiment, the connection to the excitation winding 147 can also be made using connection tracks 149 which follow each other on either side of the sensor circuit board (not shown), which will not couple with the sensor windings. Therefore, it is not necessary, in this embodiment, to deliberately provide an imbalance between the excitation winding 147 and the sensor windings 135 and 137 in order to counter any imbalance caused by the connection tracks. This is possible, because the connection can be made to the excitation coil at one end thereof. However, there may be applications where this is not possible and the connection must be made somewhere in the centre of the sensor windings 135 and 137. In this case, an imbalance will be created by the connection tracks to the excitation winding 147 and therefore a further imbalance will have to be added in a similar manner to the way in which it was added in the first embodiment in order to counter this balance.

As those skilled in the art will appreciate, the linear embodiment shown in FIG. 7 also has many of the advantages described above for the rotary embodiment, including that the width of the sensor coils is maximised for a given sensor board width, thus increasing signal levels. This is especially important where there is pressure to reduce the overall width of the position sensor so that it can, for example, fit into a small diameter tube.

The above embodiments have been described with reference to forming the sensor windings and the excitation windings on a two-layer printed circuit board. Similar considerations will also apply where these windings are formed using thick or thin film technologies, in which, a first layer of conductive film is provided over a ceramic insulating substrate, followed by an insulating layer (which may be patterned so as to only insulate at the crossover points) followed by a second conductive film to generate the set of excitation and sensor windings.

In the above embodiment, a separate mixer was provided for demodulating the signals from the respective sensor windings and the demodulated signals were then passed, via a switch, to a common filter and analogue-to-digital converter and then to the microprocessor. In an alternative embodiment, separate filters and analogue-to-digital converters can be provided for the output of each of the mixers. Additionally, all this circuitry could be implemented using a digital ASIC (application specific integrated circuit), which would reduce the overall cost and complexity of the design.

In the first embodiment, the resonator was arranged to have a coil for each period of the sensor winding. This ensured that there was a constant coupling between the resonator and the excitation winding for all rotation angles of the resonator board. This is preferred but is not essential. In particular, if the coupling between the resonator and the excitation winding varies with position, this variation will be common to both signals induced in the sensor windings and will be removed due to the ratiometric calculation performed by the microprocessor.

In the above embodiment, a resonator was used to generate a magnetic field which varied as the resonator moved relative to the sensor windings. A similar magnetic field can be generated by other electromagnetic elements, such as from ferrite pole pieces or from short-circuit coils or metal screens. Such a short-circuit coil embodiment could use the coils 53, 55 and 57 shown in FIG. 3 but with the ends connected in series rather than connected through a capacitor. In an embodiment which uses a short-circuit coil or a metal screen, the coupling of magnetic flux between the excitation winding and the sensor windings will be governed by the presence or absence of the short-circuit coil or the metal screen, and a careful design of the location of the coils or screens gives rise to a similar set of sinusoidally varying output signals from the sensor windings. Such a position encoder has the advantage that it is cheaper than the resonator design. However, the resonator design is preferred because it provides much greater output signal levels, it allows a pulse-echo mode of operation to be used (in which a burst of excitation signal is applied to the excitation winding and the signals on the sensor windings are only processed after the burst has ended—this is possible because the resonator continues to "ring" after the excitation signal has been removed) and because the resonator signals are 90° out of phase with the excitation signals, making them easier to isolate from any excitation breakthrough signals.

In the above embodiments, an excitation signal is applied to the excitation winding and the signals induced in the sensor windings were used to determine the position of the resonator. In an alternative embodiment, the excitation signal could be applied to each of the sensor windings in turn, in order to energise the resonator and the signals induced in the excitation circuit by the resonator would then carry the position information.

In the first embodiment, the excitation winding did not extend beyond the centre points of the resonator coils, since this reduces the magnetic coupling between the excitation winding and the resonator. However, the effect of this reduces as the gap between the sensor circuit board and the resonator circuit board increases. This is because the effective radius of the excitation coil's field increases as this gap increases. The overall impact is a reduction in the dynamic range of signal level which is received as the resonator gap varies, and this is often of benefit to the processing electronics in applications where significant gap variations are experienced. Another benefit of this modification is that the maximum possible inductance of the excitation coil can be increased.

What is claimed is:

1. An apparatus for use in a position encoder comprising:
    a first plurality of conductor tracks arranged along a measurement path;
    a second plurality of conductor tracks arranged along said measurement path;
    wherein the first and second pluralities of conductor tracks are superimposed on each other to define (i) a first circuit having at least two series connected loops arranged along the measurement path; and (ii) a second circuit having at least one loop which extends along said measurement path;
    characterised in that the conductor tracks of said first plurality of conductor tracks which form part of said first circuit are arranged in first and second groups which are transversely spaced relative to said measurement path;
    the conductor tracks of said second plurality of conductor tracks which form part of said first circuit are arranged for connecting conductor tracks in the first group with conductor tracks in the second group; and
    the conductor track or tracks of said first plurality of conductor tracks which form said at least one loop of said second circuit are located between and electrically separate from said first and second groups of conductor tracks.

2. An apparatus according to claim 1, wherein said first and second plurality of conductor tracks are carried on a respective side of a substantially planar insulator.

3. An apparatus according to claim 1, wherein said first and second plurality of conductor tracks are formed on a respective side of a printed circuit board.

4. An apparatus according to claim 1, wherein said loops of said first circuit have a generally hexagonal shape.

5. An apparatus according to claim 1, wherein said first and second plurality of conductor tracks define a plurality of said first circuits which are electrically separate from each other and are located one on the other, and wherein the at least two loops of the respective first circuits are spatially separated along said measurement path.

6. An apparatus according to claim 1, wherein said first circuit comprises an even number of said loops which are arranged in succession along said measurement path.

7. An apparatus according to claim 1, wherein said first and second circuits are arranged so that there is substantially no net electromagnetic coupling therebetween.

8. An apparatus according to claim 1, wherein said at least two loops are wound to have opposite sense and wherein a coupling area between one or more loops of one sense of said first circuit and said at least one loop of said second circuit is varied to oppose the effect of a variation in coupling between the at least one loop of said second circuit and a loop of the other sense of the first circuit caused by an arrangement of conductor tracks to said at least one loop of said second circuit.

9. An apparatus according to claim 1, wherein said second circuit comprises a plurality of turns of a spiral wound conductor track.

10. An apparatus according to claim 1, wherein said second circuit comprises a plurality of concentric spiral windings wound in the same sense and connected in series.

11. An apparatus according to claim 1, wherein said second circuit comprises at least one outer loop and at least one inner loop, and wherein said inner and outer loops are wound in the opposition direction to each other.

12. An apparatus according to claim 1, wherein said measurement path is linear.

13. An apparatus according to claim 1, wherein said measurement path is circular.

14. An apparatus according to claim 1, wherein said first and second pluralities of conductor tracks are arranged so that each loop of said first circuit is formed by a plurality of turns of conductor, and wherein the turns of conductor are spatially separated in the measurement direction so as to reduce spatial harmonic distortions.

15. An apparatus according to claim 1, wherein a pair of electrically separated connection tracks are provided to said first circuit and wherein one of said connection tracks is superimposed on the other connection track when viewed in a direction perpendicular to said measurement path.

16. An apparatus according to claim 1, wherein the area enclosed by each of the loops of said first circuit are substantially the same.

17. A position sensor comprising:
    first and second members which are relatively moveable along a measurement path;
    said first member comprising an apparatus according to claim 1; and
    said second member comprising means for interacting with said circuits on said apparatus such that in response to an input driving signal applied to one of said circuits, there is induced in the other said circuit an output signal which varies as a function of the relative position between said first and second members along said measurement path.

18. A sensor according to claim 17, wherein said interacting means comprises an electromagnetic field generator.

19. A sensor according to claim 17, wherein said interacting means comprises at least one of: an electromagnetic resonant device, a short circuit coil, a conductive screen or a ferrite pole piece.

20. A sensor according to claim 17, wherein said interacting means and said at least two loops of said first circuit are arranged so that said output signal continuously varies as a function of the relative position of said first and second members along said measurement path.

21. A sensor according to claim 20, wherein said output signal varies periodically as a function of the relative position between said interacting means and said at least two loops.

22. A sensor according to claim 21, wherein said periodic variation is substantially sinusoidal.

23. A sensor according to any of claims 17, further comprising drive means for applying said input driving signal to one of said first and second circuits and processing means for processing the signal generated in said other circuit and for providing an indication therefrom of the relative position of said first and second members.

24. A sensor according to claim 23, wherein said processing means comprises a demodulator which is matched to the phase of the signal generated in said other circuit by said interacting means.

25. A sensor according to claim 24, wherein said demodulator is operable to demodulate said signal using a 90° phase shifted version of the excitation signal.

26. A sensor according to claims 23, wherein said apparatus comprises two or more of said first circuits, wherein the loops of the respective first circuits are spatially separated along said measurement path and wherein said processing circuit is operable to perform a trigonometric ratio calculation of the signals generated in said two or more first circuits.

27. A sensor according to any of claims 23, wherein said output signal generated in said other circuit varies sinusoidally as a function of the position along said path of said interacting means relative to said at least two loops, and wherein one period of said sinusoidal variation corresponds to a relative movement along the measurement path of the extent of two of said series connected loops.

28. A sensor according to any of claims 23, wherein said first and second circuits are mounted on a circuit board, and wherein said drive means and/or said processing means is mounted on said circuit board.

29. A sensor according to any of claims 17, wherein said first and second circuits are formed on substantially planar surfaces.

30. A sensor according to claim 29, wherein said interacting means comprises a coil and wherein the axis of the coil is generally perpendicular to said planar surface.

31. A sensor according to claim 30, wherein the first and second circuits lie in substantially the same plane, and wherein said coil is movable relative to said first and second circuits in a plane which is substantially parallel to the plane in which said first and second circuits lie.

32. A sensor according to any of claims 17, wherein said first member is fixed and wherein said second member is movable with respect to said first member.

33. A method of detecting the position of first and second members which are relatively moveable along a measurement path, the method comprising the steps of:
providing a position sensor according to claim 17;
applying a drive signal to one of the circuits on said apparatus; and
detecting the signal generated in said other circuit and deriving therefrom the relative position of said first and second members.

34. A method according to claim 33, wherein said driving signal comprises an alternating signal having a frequency in the range of 10 KHz to 10 MHz.

35. An apparatus for use in a position encoder comprising:
an insulator base defining first and second surfaces which extend along a measurement path;
a first plurality of conductor tracks arranged on said first surface along said measurement path;
a second plurality of conductor tracks arranged on said second surface along said measurement path;
wherein the insulator base comprises a plurality of via holes for connecting the conductor tracks on the first surface to the conductor tracks on the second surface to define (i) a first circuit having at least two series connected loops arranged along the measurement path; and (ii) a second circuit having at least one loop which extends along said measurement path;
characterised in that the first and second plurality of conductor tracks and said via holes are arranged so that the at least one loop of said second circuit extends across the at least two loops of said first circuit.

36. An apparatus for use in a position encoder comprising:
an insulator base defining first and second surfaces which extend along a measurement path;
a first plurality of conductor tracks arranged on said first surface along said measurement path;
a second plurality of conductor tracks arranged on said second surface along said measurement path;
wherein the insulator base comprises a plurality of via holes for connecting the conductor tracks on the first surface to the conductor tracks on the second surface to define (i) a first circuit having at least two series connected loops arranged along the measurement path; and (ii) a second circuit having at least one loop which extends along said measurement path;
characterised in that:
the conductor tracks on said first surface which form part of said first circuit are arranged in first and second groups which are transversely spaced relative to said measurement path;
the conductor tracks on said second surface which form part of said first circuit are arranged for connecting conductor tracks in the first group with conductor tracks in the second group; and
the conductor track or tracks which form said at least one loop of said second circuit are carried by said first surface between said first and second groups.

37. An apparatus for use in a position sensor, comprising:
two layers of conductor tracks insulated, at least at any crossovers, by an insulator, the conductor tracks being arranged so as to define (i) a first circuit having at least two loops of opposite sense which extend along a measurement path, said loops being connected in series and being arranged so that signals generated in said at least two loops by a common electromagnetic field oppose each other; and (ii) a second circuit having at least one loop which extends along said measurement path and which is superimposed on but electrically isolated from said at least two loops of said first circuit;
wherein an electromagnetic coupling area between the at least one loop of said second circuit and one or more loops of one sense of said first circuit is varied to oppose the effect of a variation in coupling between the at least one loop of said second circuit and a loop of the other sense of said first circuit caused by an arrangement of connector tracks to said second circuit.

38. An apparatus according to claim 37, wherein said two layers of conductor tracks are each carried on a respective side of a substantially planar insulator.

39. An apparatus according to claim 37, wherein said conductor tracks are formed by patterned conductor films formed on a substrate, and wherein an insulator film is provided at least at the crossover points between the conductive films forming said first and second circuits.

40. An apparatus according to claim 37, wherein said second circuit comprises a plurality of series connected concentric spiral windings, ends of which are connected to said connector tracks.

41. An apparatus according to claim 40, wherein the coupling area between the at least one loop of said second circuit and one or more loops of one sense of said first circuit is varied in the vicinity of the ends of the spiral windings.

42. An apparatus for use in a position encoder comprising:
an insulator base defining first and second surfaces which extend along a measurement path;
a first plurality of conductor tracks arranged on said first surface along said measurement path;
a second plurality of conductor tracks arranged on said second surface along said measurement path;
wherein the insulator base comprises a plurality of via holes for connecting the conductor tracks on the first surface to the conductor tracks on the second surface to define (i) a first circuit having at least two loops along the measurement path, said loops being connected in series and being arranged so that signals generated in said at least two loops by a common electromagnetic field oppose each other; and (ii) a second circuit having at least one loop which extends along said measurement path and which is superimposed on but electrically isolated from said at least two loops of said first circuit;
wherein an electromagnetic coupling area between the at least one loop of said second circuit and one or more loops of one sense of said first circuit is varied to oppose the effect of a variation in coupling between the at least one loop of said second circuit and a loop of the other sense of said first circuit caused by an arrangement of connector tracks to said second circuit.

43. An apparatus for use in a position sensor comprising:
a first plurality of conductor tracks arranged in a first layer along a measurement path;
a second plurality of conductor tracks arranged in a second layer along said measurement path;
wherein the first and second pluralities of conductor tracks are superimposed on each other and connected together to define first and second circuits;
wherein the conductor tracks in said first layer which form part of said first circuit are arranged in first and second groups which are transversely spaced relative to said measurement path;
wherein the conductor tracks in said second layer which form part of said first circuit are arranged for connecting conductor tracks in the first group with conductor tracks in the second group; and
wherein the conductor track or tracks which form said second circuit are arranged in said first layer between said first and second groups of conductor tracks.

44. An apparatus according to claim 43, wherein said first and second layers of conductor tracks are carried on a respective side of a substantially planar insulator (15).

45. An apparatus according to claim 43, wherein said first and second layers of conductor tracks are formed on a respective side of a printed circuit board (15).

46. An apparatus according to claim 43, wherein said second circuit (131) comprises at least one outer loop and at least one inner loop, and wherein said inner and outer loops are wound in the opposite direction to each other.

47. An apparatus for use in a position sensor comprising:
an insulator base defining first and second surfaces which extend along a measurement path;
a first plurality of conductor tracks arranged on said first surface along said measurement path;
a second plurality of conductor tracks arranged on said second surface along said measurement path;
wherein the insulator base comprises a plurality of via holes for connecting the conductor tracks on the first surface to the conductor tracks on the second surface, the conductor tracks on said first surface and the conductor tracks on said second surface being arranged so that when connected together through said vias, they define first and second circuits;
wherein the conductor tracks on said first surface which form part of said first circuit are arranged in first and second groups which are transversely spaced relative to said measurement path;
wherein the conductor tracks on said second surface which form part of said first circuit are arranged for connecting conductor tracks in the first group with conductor tracks in the second group; and
wherein the conductor track or tracks which form said second circuit are carried by said first surface between said first and second groups.

48. An apparatus for use in a position encoder comprising:
a first plurality of conductor tracks arranged in a first layer along a measurement path;
a second plurality of conductor tracks arranged in a second layer along said measurement path;
wherein the first and second pluralities of conductor tracks are superimposed on each other to define first and second circuits;
wherein the conductor tracks in said first layer which form part of said first circuit are arranged in first and second groups which are transversely spaced relative to said measurement path;
the conductor tracks in said second layer which form part of said first circuit are arranged for connecting conductor tracks in the first group with conductor tracks in the second group; and
the conductor track or tracks which form said second circuit are arranged in said first layer between said first and second groups of conductor tracks.

49. An apparatus according to claim 48, wherein said first and second plurality of conductor tracks define a plurality of said first circuits, each having one or more loop portions extending along said measurement path, with the conductor tracks of each first circuit being separate from each other along the measurement path.

50. An apparatus according to claim 49, wherein each first circuit comprises at least two loops arranged along said measurement path, said loops being connected in series and being arranged so that signals generated in said at least two loops by a common electro-magnetic field oppose each other.

* * * * *